United States Patent
Kim

(10) Patent No.: US 10,394,305 B2
(45) Date of Patent: Aug. 27, 2019

(54) MEMORY SYSTEM AND METHOD OF OPERATING THE SAME

(71) Applicant: Samsung Electronics Co., Ltd., Suwon-si, Gyeonggi-do (KR)

(72) Inventor: Kwanghyun Kim, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/829,101

(22) Filed: Dec. 1, 2017

(65) Prior Publication Data

US 2018/0232042 A1    Aug. 16, 2018

(30) Foreign Application Priority Data

Feb. 15, 2017  (KR) .......................... 10-2017-0020634

(51) Int. Cl.
| | |
|---|---|
| *G06F 12/02* | (2006.01) |
| *G06F 1/3234* | (2019.01) |
| *G11C 11/4074* | (2006.01) |
| *G06F 3/06* | (2006.01) |
| *G06F 12/0871* | (2016.01) |

(52) U.S. Cl.
CPC ............ *G06F 1/3275* (2013.01); *G06F 3/061* (2013.01); *G06F 3/0679* (2013.01); *G11C 11/4074* (2013.01); *G06F 12/0246* (2013.01); *G06F 12/0871* (2013.01); *G06F 2212/7201* (2013.01)

(58) Field of Classification Search
CPC .................................................. G06F 12/0871
See application file for complete search history.

(56) References Cited

U.S. PATENT DOCUMENTS

| | | | |
|---|---|---|---|
| 5,420,984 A * | 5/1995 | Good | G06F 13/287 709/212 |
| 8,341,311 B1 | 12/2012 | Szewerenko et al. | |
| 9,454,214 B2 | 9/2016 | Bahnsen et al. | |
| 2009/0031072 A1 | 1/2009 | Sartore | |
| 2014/0181558 A1 | 6/2014 | Taha et al. | |
| 2014/0304453 A1 | 10/2014 | Shao et al. | |
| 2015/0248250 A1 | 9/2015 | Han et al. | |
| 2015/0309927 A1 | 10/2015 | Sinclair et al. | |

\* cited by examiner

*Primary Examiner* — Edward J Dudek, Jr.
(74) *Attorney, Agent, or Firm* — Myers Bigel, P.A.

(57) ABSTRACT

A memory system according to example embodiments of the inventive concept may include a storage device and a memory device. The storage device includes a first interface circuit configured to be connected to a processor and a second interface circuit different from the first interface circuit. The memory device includes a third interface circuit configured to be connected to the processor based on a DRAM interface, a fourth interface circuit configured to be different from the third interface circuit and configured to be connected to the second interface circuit, and a random access memory divided into a first memory area and a second memory area. The first memory area is accessed by the processor through the third interface circuit and the second memory area is accessed by the storage device through the second interface circuit and the fourth interface circuit.

17 Claims, 17 Drawing Sheets

MEMORY SYSTEM AND METHOD OF OPERATING THE SAME

CROSS-REFERENCE TO RELATED APPLICATIONS

This U.S. non-provisional patent application claims priority under 35 U.S.C. § 119 of Korean Patent Application No. 10-2017-0020634, filed on Feb. 15, 2017, the entire contents of which are hereby incorporated by reference.

BACKGROUND

The present inventive concept relates to semiconductor memory devices, and, more particularly, to a memory system and a method of operating the same.

A semiconductor memory device may be implemented using a semiconductor, such as silicon Si, germanium Ge, gallium arsenide GaAs, indium phosphide InP, etc. A semiconductor memory device may be classified as a volatile memory device or a nonvolatile memory device.

Generally, a memory system uses a memory device having a relatively high speed as a main memory. A memory system may also use a nonvolatile memory device that retains its stored data even when its power is interrupted as storage. For example, the m in memory may include a DRAM device, etc. and the storage may include, a flash memory device (e.g., a NAND-type flash memory, a NOR-type flash memory, etc.).

As the demand for memory systems having higher performance and higher efficiency increases, a SSD (solid state drive), an eMMC (embedded multi media-card), etc. in which a controller and a flash memory device are embedded together are being developed. A MDS (managed DRAM solution) in which a controller and a DRAM device are embedded together is also being developed. However, a new memory device, such as a MDS (managed DRAM solution), may require the memory system to use an interface different from an existing DRAM interface.

SUMMARY

Example embodiments of the inventive concept provide a memory system including a storage device and a memory device. The storage device includes a first interface circuit configured to be connected to a processor and a second interface circuit different from the first interface circuit. The memory device includes a third interface circuit configured to be connected to the processor based on a DRAM interface, a fourth interface circuit configured to be different from the third interface circuit and configured to be connected, to the second interface circuit, and a random access memory divided into a first memory area and a second memory area. The first memory area is accessed by the processor through the third interface circuit and the second memory area is accessed by the storage device through the second interface circuit and the fourth interface circuit.

Example embodiments of the inventive concept provide a method of operating a memory system including a storage device and a memory device connected to the storage device. The method may include performing, by the processor, a first handshaking operation with the storage device and a second handshaking operation with the memory device, in the processor, dividing the memory device into a first memory area and a second memory area, allocating the first memory area to first addresses, and allocating the second memory area to second addresses, providing, by the processor, the second addresses to the storage device, and performing, by the storage device, a third handshaking operation with the memory device.

Example embodiments provide a memory system that includes a volatile main memory device comprising a first auxiliary interface circuit, a nonvolatile storage device comprising a second auxiliary interface circuit, and a processor component including a main memory controller that is configured to control operation of the volatile main memory device and a storage controller that is configured to control operation of the nonvolatile storage device. The volatile main memory device and the nonvolatile storage device are configured to communicate via the first auxiliary interface circuit and the second auxiliary interface circuit without passing through the processor component.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF THE FIGURES

Embodiments of the inventive concept will be described below in more detail with reference to the accompanying drawings. The embodiments of the inventive concept may, however, be implemented in different forms and should not be constructed as limited to the embodiments set forth herein. Rather, these embodiments are provided so that this disclosure will be thorough and complete, and fully convey the scope of the inventive concept to those skilled in the art. Like numbers refer to like elements throughout.

DETAILED DESCRIPTION OF THE EMBODIMENTS

Below, example embodiments of inventive concepts will now be described more fully so that those skilled in the art can easily comprehend the inventive concepts.

Figure 1:
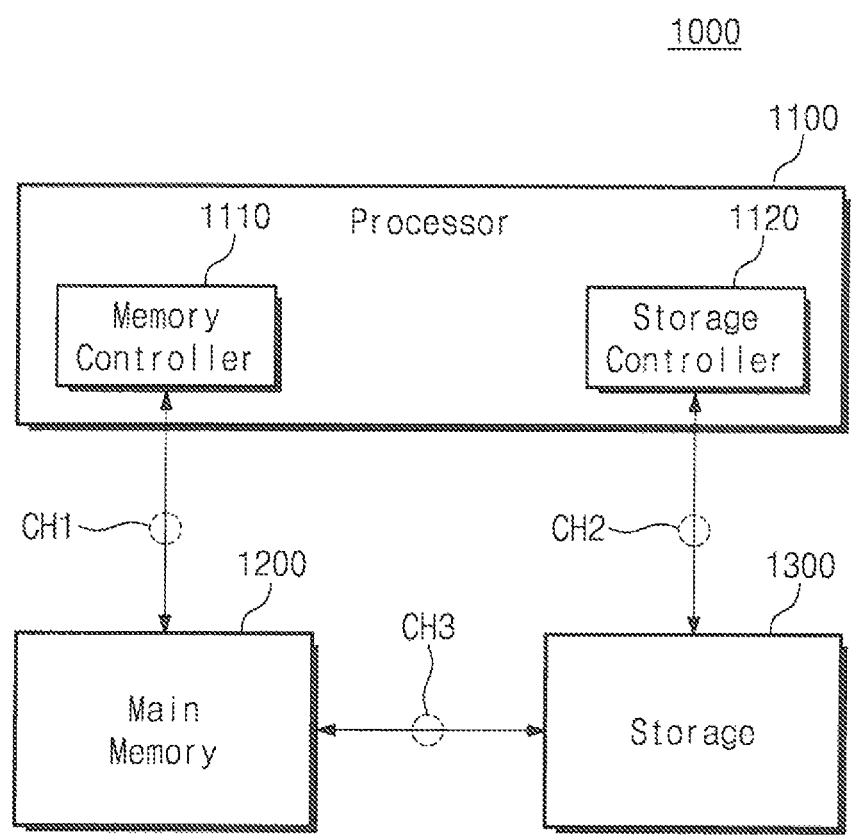
FIG. 1 is a block diagram illustrating a memory system according to example embodiments of the inventive concept.

FIG. 1 is a block diagram illustrating a memory system according to example embodiments of the inventive concept. Referring to FIG. 1, a memory system 1000 may include a processor 1100, a main memory 1200, and storage 1300.

The memory system 1000 comprises a set of electronic devices (a processor, a memory device, etc.) organized to provide a specific function to a user using a memory and operation resources. The memory system 1000 may be included in a variety of device types including, but not limited to, a computing device (e.g., a personal computer, a peripheral device, a digital camera, a PDA (personal digital assistant), a PMP (portable media player), a smart phone, a tablet, and a wearable device, etc.) including at least one processor.

The processor 1100 may perform various arithmetic operations/logical operations to manage and process overall operations of the memory system 1000. For example, the processor 1100 may be a processor circuit or a system including a general-purpose processor or an application processor.

The processor 1100 may include a memory controller 1110 and a storage controller 1120. According to a command of the processor 1100, the memory controller 1110 manages and processes overall operations of the main memory 1200 and the storage controller 1120 manages and processes overall operations of the storage 1300. The memory controller 1110 is connected to the main memory 1200 through a first channel CH1. The memory controller 1110 may read data from the main memory 1200 or may write data in the main memory 1200 through the first channel CH1. The storage controller 1120 is connected to the storage 1300 through a second channel CH2. The storage controller 1120 may read data from the storage 1300 or may write data in the storage 1300 through the second channel CH2.

Each of the main memory 1200 and the storage 1300 may store data provided from the processor 1100. Each of the main memory 1200 and the storage 1300 may read data and provide the read data to the processor 1100 according to a request from the processor 1100.

The main memory 1200 may include a RAM (random access memory). For example, the main memory 1200 may include a DRAM (dynamic random access memory), a SRAM (static RAM), a TRAM (thyristor RAM), etc.

The main memory 1200 may be a DRAM-based volatile memory device. For example, the main memory 1200 may include a DDR (double data rate), LDDR (low power DDR), and/or GDDR (graphic DDR)-based volatile memory. In this case, the first channel CH1 may be implemented by a DRAM-based interface (e.g., DDR, LPDDR, GDDR, etc.). In the present specification, the 'interface' may include hardware side embodiments (e.g., the number of pads, a pad arrangement, the number of internal channels, etc.) and software side embodiments (e.g., protocol, command, etc.). The embodiments of the 'interface' may include standards defined by the JEDEC standard.

The storage 1300 may include a nonvolatile memory. For example, the storage 1300 may include an EEPROM (electrically erasable programmable read-only memory), a flash memory, a MRAM (magnetic random access memory), a spin-transfer torque MRAM, a CBRAM (conductive bridging RAM), a FeRAM (ferroelectric RAM), a PRAM (phase change RAM) which is called an ovonic unified memory (OUM), a RRAM (resistive RAM), a nanotube RRAM, a PoRAM (polymer RAM), a NFGM (nanotube floating gate memory), a holographic memory, a molecular electronics memory device, and/or an insulator resistance change memory. One or more bits may be stored in a unit cell of the nonvolatile memory.

The storage 1300 may be a flash memory-based nonvolatile memory device. For example, the storage 1300 may include a SSD (solid state drive), an eMMC (embedded multi-media card), a UFS (universal flash storage) card, an embedded UFS, etc. In this case, the second channel CH2 may be implemented by UFS, eMCC, SATA (serial advanced technology attachment), PCIe (peripheral component interconnect express), and/or USB (universal serial bus)-based interfaces. However, the examples described above are not to limit the scope of the inventive concept.

Below, for convenience of description, it is assumed that the main memory 1200 includes a single volatile memory device and the storage 1300 may include a single nonvolatile memory device.

In the memory system 1000 according to an embodiment of the inventive concept, the main memory 1200 and the storage 1300 may be connected to each other through a third channel CH3. The main memory 1200 and the storage 1300 may exchange information including data, a command, an address, etc. with each other. Each of the main memory 1200 and the storage 1300 may include a specific interface (not shown) to drive the third channel CH3.

The third channel CH3 may be implemented in various types of interfaces according to different embodiments of the inventive concept. For example, the third channel CH3 may be implemented by DRAM, UFS, eMMC, SATA, PCIe, and/or USB-based interfaces. Alternatively, the third channel CH1 may be implemented by a simplified interface to exchange only information, such as data, a command, and an address. The specific interface (not shown) included in the main memory 1200 and the storage 1300 may be implemented in various forms. However, the examples described above are not to limit the scope of the inventive concept.

Each of the first through third channels (CH1 to CH3) may include conductive material formed on a PCB (printed circuit board) or a main board. Each of the first through third channels (CH1 to CH3) may also include a wire pattern, a trace pattern, etc. For example, the conductive material may be implemented by a wire, a trace, a conductive plate, etc.

The main memory 1200 is a storage device that stores a program configured for execution by the processor 1100 and data which the corresponding program uses. For example, the main memory 1200 may store an operating system (OS), meta data, an application, etc. read from the storage 1300. The storage 1300 is a storage device used to supplement a limited memory capacity of the main memory 1200. The storage 1300 may be implemented by a nonvolatile memory, which retains its stored data even when its power is interrupted. For example, the storage 1300 may store data used when it is booted, such as a basic input output system (BIOS), an operating system, etc. Generally, the processor 1100 reads data from the storage 1300 and loads the read data into the main memory 1200 to use it.

The main memory 1200 may be used as a buffer memory of the storage 1300. Although not illustrated in FIG. 1, the storage 1300 may include a controller (that will be described in FIG. 9) to manage operations of the storage 1300. The buffer memory of the storage 1300 may be used to assist operations of the controller. For example, the buffer memory of the storage 1300 may temporarily store data, which is used for operations of the controller. As the main memory 1200 is used as the buffer memory of the storage 1300, operation efficiency of the storage 1300 may be improved.

According to an embodiment of the inventive concept, the storage 1300 may temporarily store (buffer) data write-requested or read-requested by the processor 1100 in the main memory 1200. Alternatively, the storage 1300 may load meta data used to manage the storage 1300 into the main memory 1200 to use it. The meta data may include various data, which is used when the storage 1300 operates and is not accessed by the processor 1100. For example, the meta data may include mapping information between logical addresses used in the processor 1100 and physical addresses used inside the storage 1300. The storage 1300 may directly access the main memory 1200 through the third channel CH3. Various embodiments of the main memory 1200 capable of being directly accessed by the storage 1300 will be described with reference to FIGS. 2 through 8.

According to an embodiment of the inventive concept, the main memory 1200 may receive meta data of the main memory 1200 from the storage 1300 through the third channel CH3. For example, in the case where the main memory includes a plurality of memory devices, each memory device may have a different operation characteristic. To optimize an operation of each memory device, the processor 1100 may perform a training of each memory device when it is booted (initialized) or if necessary. The meta data of the main memory 1200 may be generated by the processor 1100 based on the training result. The generated meta data is stored in the storage 1300.

For example, the meta data may include a refresh period per a word line or a bank of a memory cell (not shown) of the main memory 1200, a memory cell voltage, an input reference voltage, etc. The meta data may be stored in a MRS (mode register set) or a MPR (multi-purpose register) and may include various data that controls an operation environment of the main memory 1200. When the memory system 1000 is booted or initialized, the storage 1300 may provide the stored meta data to the main memory 1200.

As the main memory 1200 uses the meta data of the main memory 1200 stored in the storage 1300, an operation efficiency of the main memory 1200 may be improved. To this end, the main memory 1200 may directly access the storage 1300 through the third channel CH3. Various embodiments of the storage 1300 capable of being directly accessed by the main memory 1200 will be described with reference to FIGS. 9 through 13.

The memory system 1000 has been described so as to include the main memory 1200 and the storage 1300 that are connected to each other through the third channel CH3. Through that configuration, the memory system 1000 can improve operation efficiency and speed of the main memory 1200 and the storage 1300. The memory system 1000 may implement a new interface between the main memory 1200 and the storage 1300 while maintaining an existing interface between the processor 1100 and the main memory 1200 and an existing interface between the processor 1100 and the storage 1300. Consequently, the memory system 1000 can improve use efficiency of the main memory 1200 and the storage 1300 by adding only the third channel CH3 in an existing structure.

Figure 2:
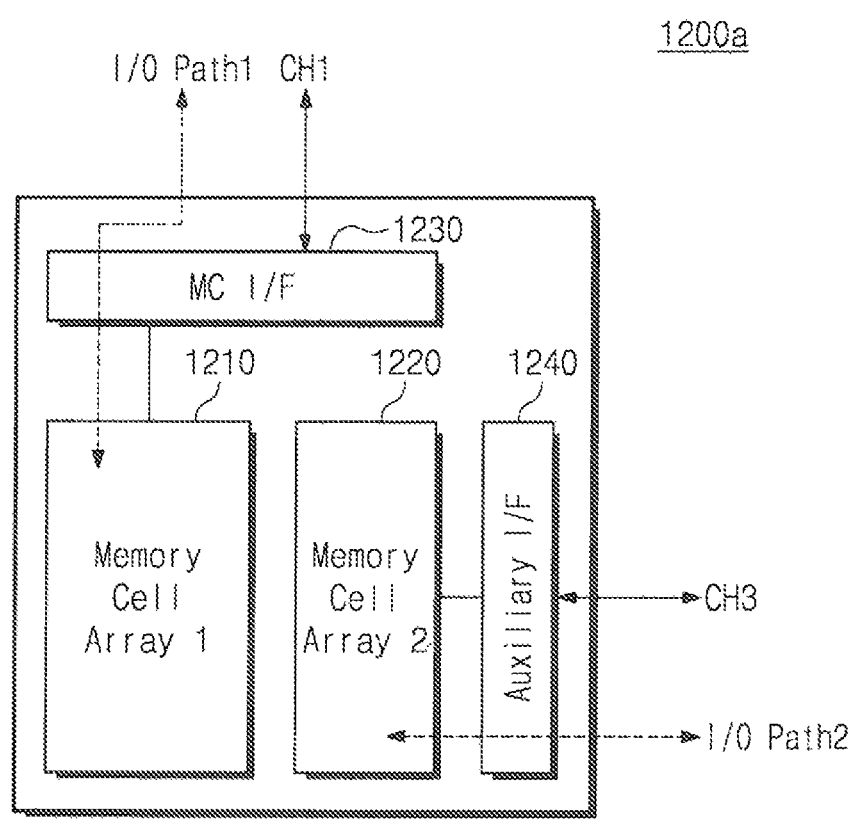
FIG. 2 is an exemplary block diagram illustrating a configuration of a main memory illustrated in FIG. 1.

FIG. 2 is an exemplary block diagram illustrating a configuration of a main memory illustrated in FIG. 1. Referring to FIG. 2, a main memory 1200a may include a first memory cell array 1210, a second memory cell array 1220, a memory controller interface (MC I/F) 1230, and an auxiliary interface 1240.

The first memory cell array 1210 may store data provided from the processor 1100 through the first channel CH1 and the memory controller interface 1230. Data stored in the first memory cell array 1210 may be provided to the processor 1100 through the memory controller interface 1230 and the first channel CH1. The first channel CH1 and the memory controller interface 1230 may form a first input/output path I/O Path1. The second memory cell array 1220 may store data provided from the storage 1300 through the third channel CH3 and the auxiliary interface 1240. The data stored in the second memory cell array 1220 may be provided to the storage 1300 through the auxiliary interface 1240 and the third channel CH3. The third channel CH3 and the auxiliary interface 1240 may form a second input/output path I/O Path2.

The first memory cell array 1210 may be accessed by the processor 1100 through the first input/output path. The first memory cell array 1210 may be used as a main memory area by the processor 1100. The second memory cell array 1220 may be accessed by the storage 1300 through the second input/output path. The second memory cell array 1220 may be used as a buffer memory by the storage 1300. Referring to FIG. 2, the first memory cell array 1210 may be physically separated from the second memory cell array 1220. That is, in some embodiments, the first memory cell array 1210 and the second memory cell array 1220 may be independently replaceable. Thus, an access through the first input/output path may not collide with an access through the second input/output path. In other embodiments, the first memory cell array 1210 and the second memory cell array 1220 may be logically separated in a common physical memory array.

For example, sizes of storage spaces of the first and second memory cell arrays 1210 and 1220 may be decided when the main memory 1220a is manufactured. The sizes of the storage spaces of the first and second memory cell arrays 1210 and 1220 may be decided so as to have various sizes according to demands thereon. For example, the size of the storage space of the first memory cell array 1210 may be designed to be greater than the size of the storage space of the second memory cell array 1220.

The memory controller interface 1230 is connected to the processor 1100 through the first channel CH1. The memory controller interface 1230 may include various types of circuits to drive an interface of the first channel CH1. As described above, the memory controller interface 1230 may transmit data provided from the processor 1100 through the first channel CH1 to the first memory cell array 1210. Conversely, the memory controller interface 1230 may transmit data stored in the first memory cell array 1210 to the processor 1100 through the first channel CH1.

The auxiliary interface 1240 is connected to the processor 1100 through the third channel CH3. The auxiliary interface 1240 may include various types of circuits to drive an interface of the third channel CH3. M described above, the auxiliary interface 1240 may transmit data provided from the storage 1300 through the third channel CH3 to the second memory cell array 1220. Conversely, the auxiliary interface 1240 transmits data stored in the second memory cell array 1220 to the storage 1300 through the third channel CH3.

Although not illustrated in the drawing, the main memory 1200a may further include peripheral circuit such as a DLL (delay locked loop), a voltage generator, a command decoder, a column decoder, a row decoder, etc. for input/ output operations of data. The first and second memory cell arrays 1210 and 1220 may share the DLL (delay locked loop), the voltage generator, the command decoder, etc. The first and second memory cell arrays 1210 and 1220 may also be driven by the shared circuitry. For example, data which is input to the first and second memory cell arrays 1210 and 1220 and data which is output from the first and second memory cell arrays 1210 and 1220 may be synchronized by a clock signal generated from the shared DLL. Thus, the main memory 1200a can process an access through the first input/output path and an access through the second input/output path using the same operation method (e.g., a synchronization method, a signaling method, etc.).

Figure 3:
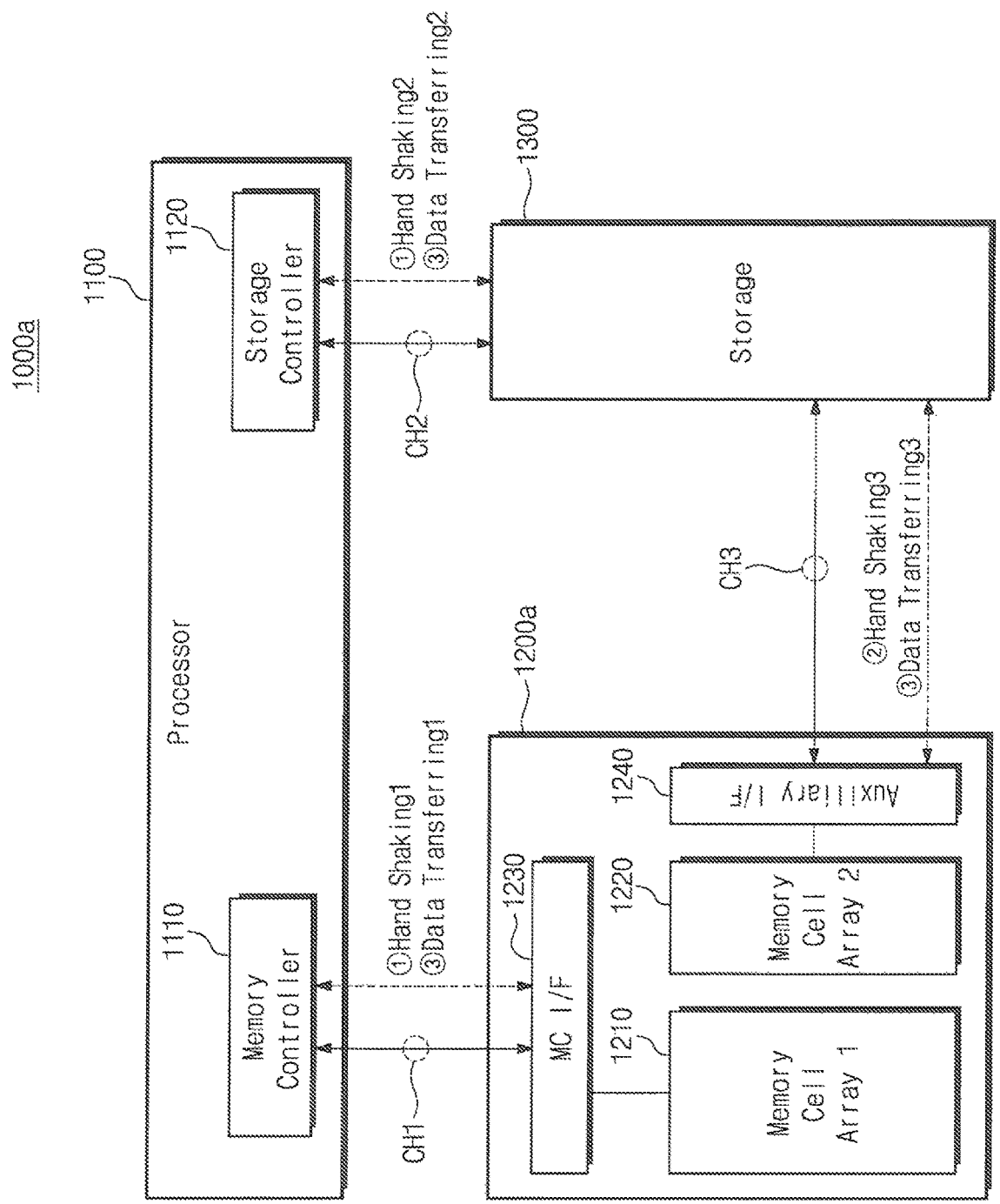
FIG. 3 is a view illustrating an operation of a memory system including a main memory of FIG. 2.

FIG. 3 is a view illustrating an operation of a memory system including a main memory of FIG. 2. Referring to FIG. 3, after the memory system 1000a begins a booting or an initialization, an operation of a memory system 1000a is illustrated.

First, the memory controller 1110 performs a handshaking1 operation with the memory controller interface 1230, and the storage controller 1120 performs a handshaking2 operation with a storage controller interface (not shown) of the storage 1300 (block ①). For example, the memory controller 1110 and the storage controller 1120 may transmit a signal to the main memory 1200a and the storage 1300, respectively, to check whether the main memory 1200a and the storage 1300 are ready to transmit and receive data. After handshaking, the memory controller 1110 recognizes a storage space of the first memory cell array 1210. The storage controller 1120 recognizes a storage space of the storage 1300. More specifically, for example, the memory controller 1110 and the storage controller 1120 may perform an on-die termination (ODT) operation check of the main memory 1200a and the storage 1300, a timing check of data or command/address being transmitted and received, and a skew correction of data or command/address being transmitted and received.

After the main memory 1200a and the storage 1300 complete a preparation operation, the storage 1300 performs a handshaking3 operation with the auxiliary interface 1240 (block ②). After handshaking, the storage 1300 recognizes a storage space of the second memory cell array 1220.

In the embodiment of FIG. 3, it is illustrated that the handshaking3 operation is performed after the handshaking1 operation and the handshaking2 operation. However, this is merely an example and the scope of the inventive concept is not limited thereto. The handshaking3 operation may be performed before the handshaking1 operation and the handshaking2 operation. The handshaking3 operation may also be performed in concurrence with the handshaking1 operation and the handshaking2 operation. These embodiments may be equally applied to embodiments described below. That is, in embodiments of FIG. 5 or in embodiments of FIG. 13, the handshaking3 operation may be performed prior to or in concurrence with the handshaking1 and the handshaking2 operation.

Subsequently, the processor 1100, the main memory 1200a, and the storage 1300 exchange data with one another (block ③). For example, the processor 1100 exchanges data with the main memory 1200a through the first channel CH1. The processor 1100 exchanges data with the storage 1300 through the second channel CH2. For example, the storage 1300 may store meta data of the main memory 1200a provided from the processor 1100. The storage 1300 also exchanges data with the main memory 1200a through the third channel CH3. As described in FIG. 1, the main memory 1200a may be used as a buffer memory of the storage 1300. The storage 1300 may also provide the stored meta data of the main memory 1200a to the main memory 1200a. Because the first memory cell array 1210 is physically and/or logically separated from the second memory cell array 1220, an access through the first channel CH1 does not collide with an access through the third channel CH3. Consequently, because the storage 1300 and the main memory 1200a are used as a storage device to assist each other, use efficiency of the storage 1300 and the main memory 1200a is improved.

Figure 4:
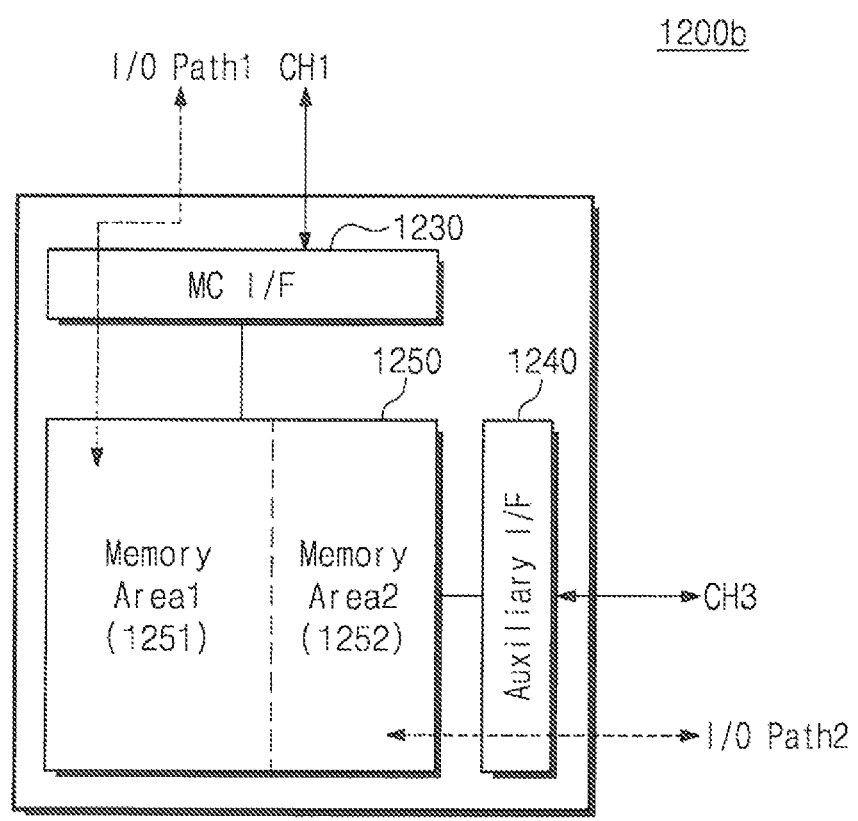
FIG. 4 is a block diagram illustrating a main memory illustrated in FIG. 1 according to other example embodiments of the inventive concept.

FIG. 4 is a block diagram illustrating a main memory illustrated in FIG. 1 according to other example embodiments of the inventive concept. Referring to FIGS. 1 and 4, a main memory 1200b may include the memory controller interface 1230, the auxiliary interface 1240, and a memory cell array 1250.

The main memory 1200b includes a single memory cell array, which is not a physically divided memory cell array in comparison with FIG. 2. A configuration of the memory controller interface 1230 and the auxiliary interface 1240 is the same as those described in FIG. 2. Thus, descriptions thereof are omitted.

The memory cell array 1250 is a monolithic memory device and may include a first memory area 1251 and a second memory area 1252. The first memory area 1251 may correspond to first addresses. The second memory area 1252 may correspond to second addresses. Here, the second addresses may be set not to include the same address as the first addresses. The first addresses and the second addresses may be allocated by the processor 1100.

Data provided from the processor 1100 through the controller interface 1230 and the first channel CH1 may be stored in the first memory area 1251. Data stored in the first memory area 1251 may be provided to the processor 1100 through the memory controller interface 1230 and the first channel CH1. Data provided from the storage 1300 through the auxiliary interface 1240 and the third channel CH3 may be stored in the second memory area 1252. Data stored in the second memory area 1252 may be provided to the storage 1300 through the auxiliary interface 1240 and the third channel CH3.

The first memory area 1251 may be accessed by the processor 1100 through the first input/output path I/O Path1. The first memory area 1251 may be used as a main memory by the processor 1100. The second memory area 1252 may be accessed by the storage 1300 through the second input/output path I/O Path2. The second memory area 1252 may be used as a buffer memory by the storage 1300. In the embodiment of FIG. 4, the first memory area 1251 may be separated from the second memory area 1252 by the first addresses and the second addresses allocated by the processor 1100.

The main memory 1200b may be implemented to be accessible using a bank interleaving method. In this case, the first memory area 1251 may include banks except banks included in the second memory cell area 1252. Additionally, the main memory 1200b may divide the banks into bank groups. That is, banks included in the first memory area 1251 may be allocated as a first bank group and banks included in the second memory area 1252 may be allocated as a second bank group. The first bank group may be connected to a first input/output buffer (not shown) and the second bank group may be connected to a second input/output buffer (not shown) separated from the first input/output buffer. The first input/output buffer may be connected to the memory controller interface 1230. The first input/output buffer sequentially provides data that is read from the first bank group to the memory controller interface 1230. The second input/output buffer may be connected to the auxiliary interface 1240. The second input/output buffer sequentially provides data that is read from the second bank group to the auxiliary interface 1240. Through the embodiments described above, an access through the first input/output path may not collide with an access through the second input/output path. However, the scope of the inventive concept is not limited thereto.

Sizes of the storage spaces of the first memory area 1251 and the second memory area 1252 are determined by the first addresses and the second addresses allocated by the processor 1100, respectively. The storage spaces of the first memory area 1251 and the second memory area 1252 may be determined to have various sizes according to embodiments of the inventive concept. For example, a size of the storage space of the first memory area 1251 may be allocated to be greater than a size of the storage space of the second memory area 1252.

The allocated second addresses (or together with the first addresses) may be provided to the storage 1300 by the processor 1100. In other embodiments, the second addresses (or together with the first addresses) may be provided to the memory controller 1110 or the storage controller 1120. For example, the memory controller 1110 and the storage controller 1120 may check an out of bound (OOB) of the second addresses (in the case where the first addresses are provided, together with the first addresses).

The first addresses and the second addresses may be reallocated by the processor 1100 if necessary. For example, when the first memory area 1251 corresponding to the first addresses is filled with stored data, at least one of the processor 1100 and the storage 1300 may generate a reallocation request of the first memory area 1251 and the second memory area 1252. In response to the reallocation request, the processor 1100 may reallocate the first addresses so that a size of the storage space of the first memory area 1251 increases. While reallocating the first addresses, the processor 1100 may reallocate the second addresses so that a size of the storage space of the second memory area 1252 decreases.

The reallocated second addresses (or together with the first addresses) are provided to the storage 1300 again by the processor 1100. The storage 1300 updates the reallocated second addresses (in the case where the first addresses are provided, together with the first addresses). If necessary, the reallocated second addresses (or together with the first addresses) may be provided to the memory controller 1110 or the storage controller 1120 again. The memory controller 1110 or the storage controller 1120 can update the reallocated second addresses (in the case where the first addresses are provided, together with the first addresses). The memory controller 1110 may access the first memory area 1251 corresponding to the reallocated first addresses and the storage 1300 may access the second memory area 1252 corresponding to the reallocated second addresses. According to the embodiment of FIG. 4, the processor 1100 may adjust a size of the storage space of the first and second memory areas 1251 and 1252 using the first and second addresses. Thus, the processor 1100 may effectively manage the first and second memory areas 1251 and 1252 according to an operating situation.

Figure 5:
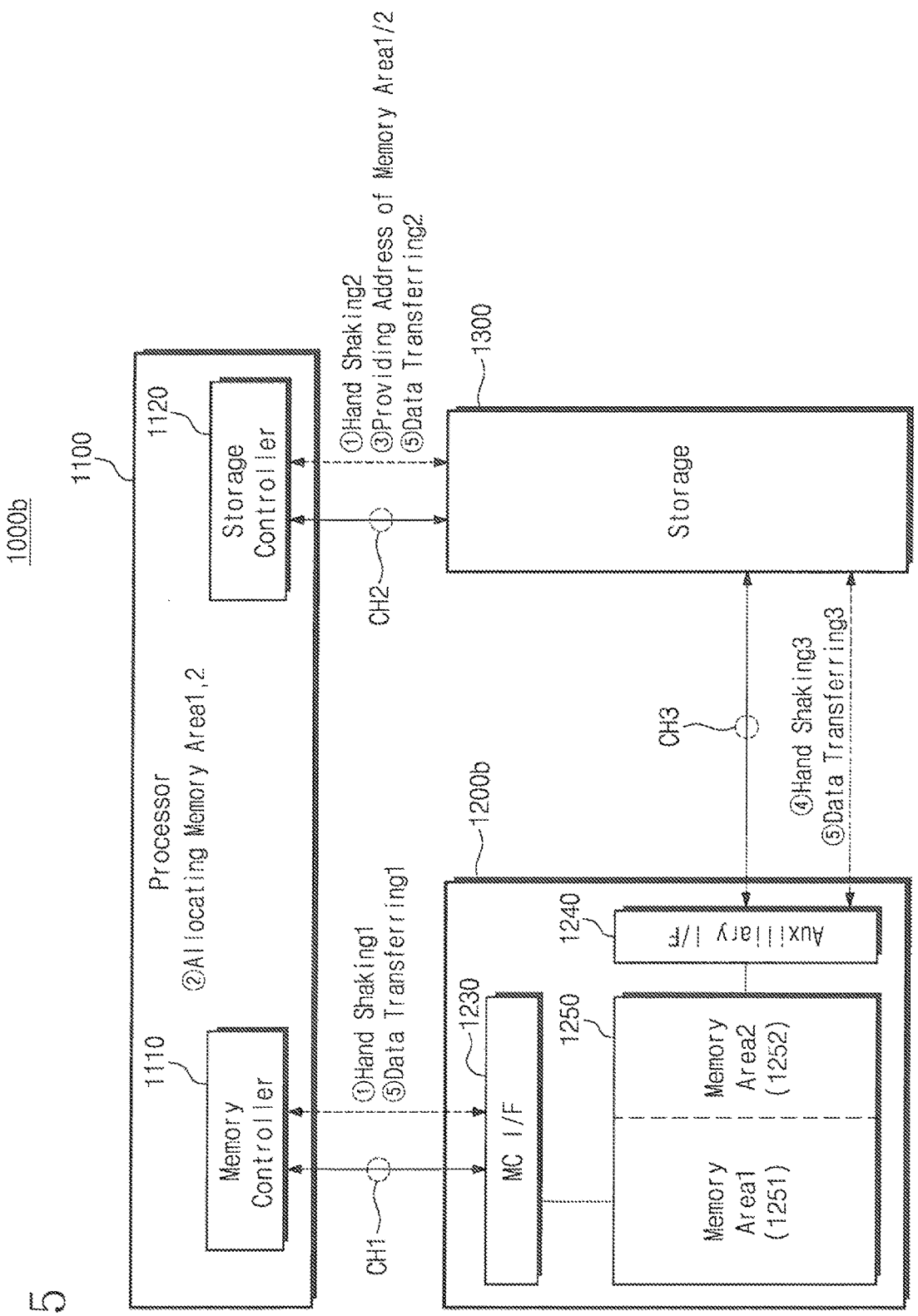
FIGS. 5 and 6 are views illustrating an operation of a memory system including a main memory of FIG. 4.
Figure 6:
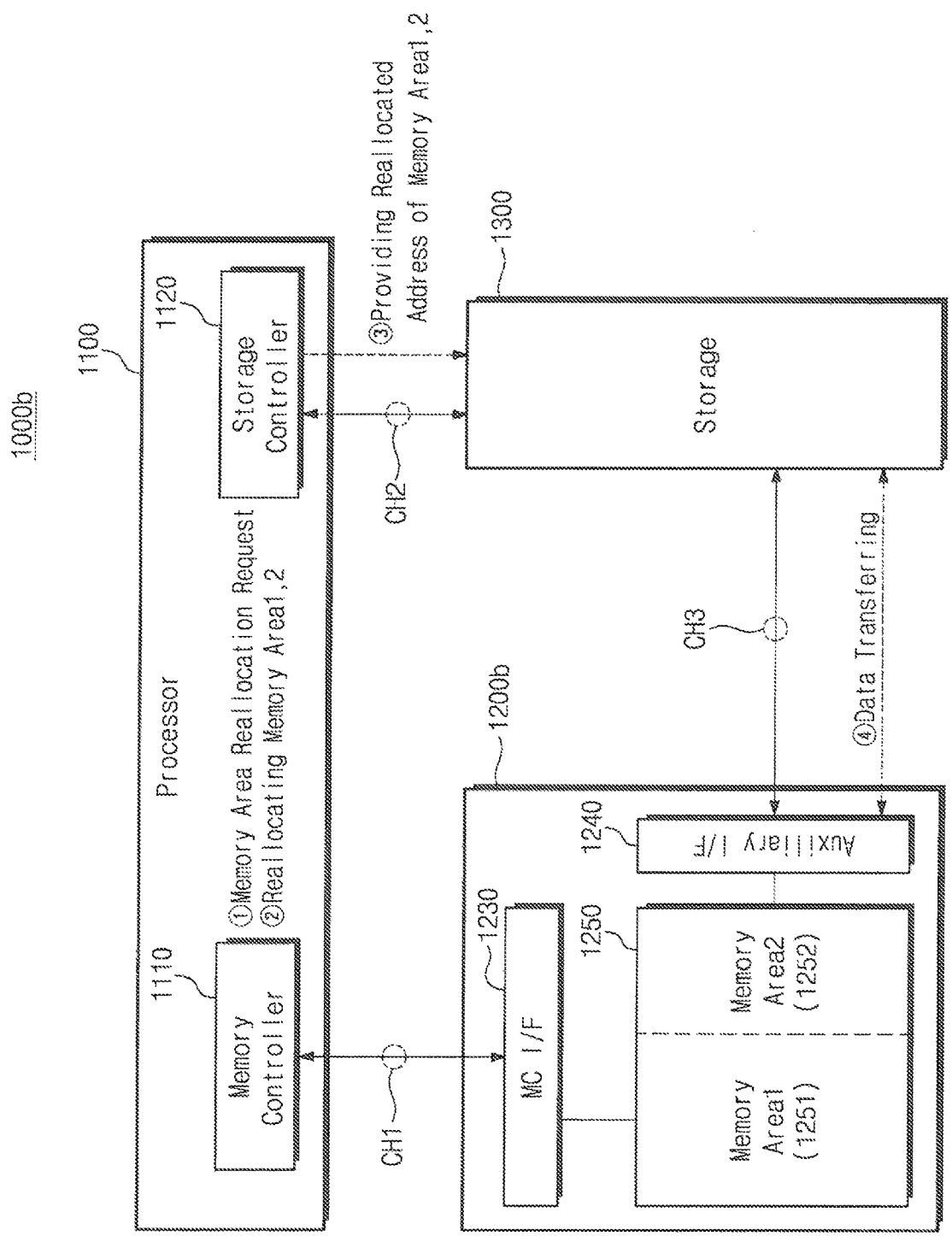

FIGS. 5 and 6 are views illustrating an operation of a memory system including a main memory of FIG. 4.

Referring to FIG. 5, after a memory system 1000*b* begins a booting or an initialization, an operation of the memory system 1000*b* including the main memory 1200*b* is illustrated. First, the memory controller 1110 performs a handshaking1 operation with the memory controller interface 1230, and the storage controller 1120 performs a handshaking2 operation with the storage controller interface (not shown) of the storage 1300 (block ①).

The processor 1100 allocates the first memory area 1251 and the second memory area 1252 (block ②). The processor 1100 allocates the first and second addresses to correspond to the first memory area 1251 and the second memory area 1252, respectively. As described above, the second addresses may be set not to include the same address as the first addresses. In some embodiments, the processor 1100 may provide the allocated second addresses (or together with the first addresses) to the memory controller 1110 or the storage controller 1120. After handshaking, the memory controller 1110 recognizes a storage space of the first memory area 1251. The storage controller 1120 also recognizes a storage space of the storage 1300.

The storage controller 1120 provides the second addresses (or together with the first addresses) to the storage 1300 (block ③). Subsequently, the storage 1300 performs a handshaking3 operation with the auxiliary interface 1240 (block ④). After handshaking, the storage 1300 recognizes a storage space of the second memory area 1252.

After storage spaces in the memory system 1000*b* are recognized by the memory controller 1110, the storage controller 1120, the processor 1100, the main memory 1200*b*, and the storage 1300 exchange data with one another as described in FIG. 3, (block ⑤). Because the first memory area 1251 is logically separated from the second memory area 1252 by the first addresses and the second addresses, an access through the first channel CH1 does not collide with an access through the third channel CH3. As described in FIG. 4, the main memory 1200*b* also may be accessed using a bank interleaving method, and banks included in the main memory 1200*b* may be divided into bank groups. Through those embodiments, the access through the first channel CH1 does not collide with the access through the third channel CH3.

Referring to FIG. 6, after a reallocation request of the first memory area 1251 and the second memory area 1252 occurs, an operation of the memory system 1000*b* is illustrated. First, the reallocation request of the first memory area 1251 and the second memory area 1252 may be generated by the at least one of processor 1100 and the storage 1300 (block ①).

The processor 1100 reallocates the first memory area 1251 and the second memory area 1252 (block ②). The processor 1100 reallocates the first addresses and the second addresses to correspond to the first memory area 1251 and the second memory area 1252, respectively. The processor 1100 provides the reallocated second addresses (or together with the first addresses) to the storage 1300 again. The storage 1300 updates the reallocated second addresses (in the case where the first addresses are provided, together with the first addresses). If necessary, the reallocated second addresses (or together with the first addresses) may be provided to the memory controller 1110 or the storage controller 1120 again. The memory controller 1110 or the storage controller 1120 can update the reallocated second addresses (in the case where the first addresses are provided, together with the first addresses).

The storage 1300 may access the second memory area 1252 corresponding to the reallocated second addresses and may exchange data with the second memory area 1252 (block ④). The memory controller 1110 may also access the first memory area 1251 corresponding to the reallocated first addresses and may exchange data with the first memory area 1251.

Figure 7:
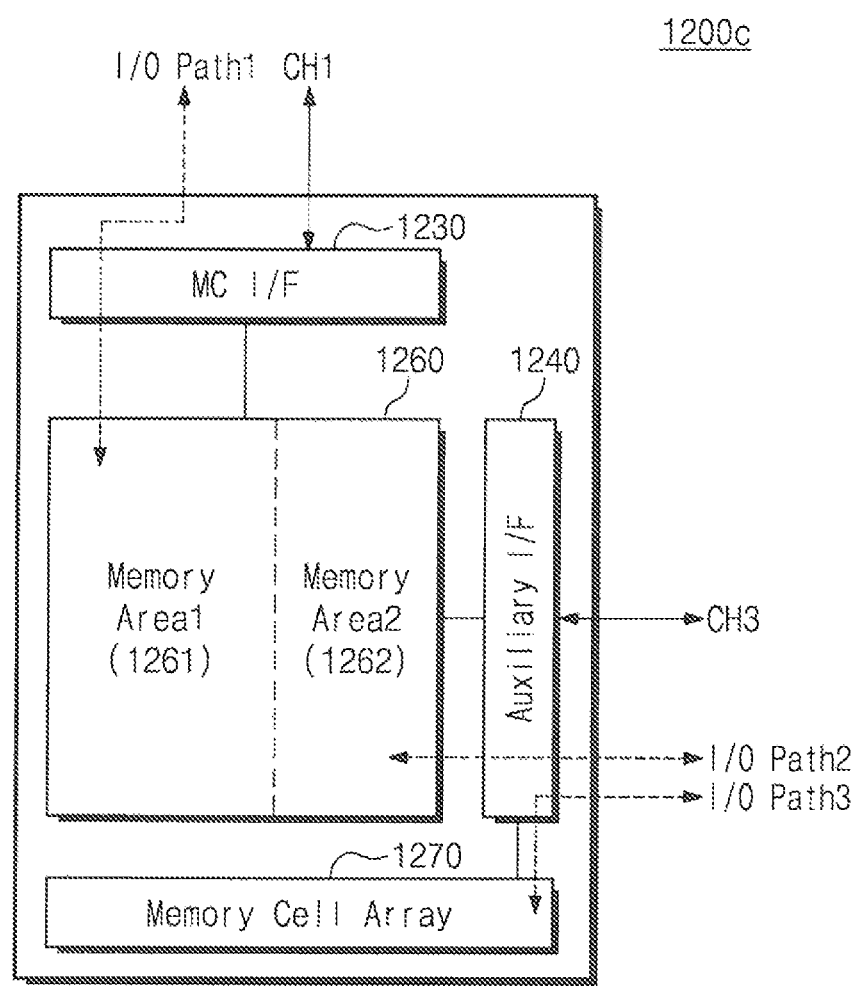
FIG. 7 is a block diagram illustrating a main memory illustrated in FIG. 1 according to other example embodiments of the inventive concept.

FIG. 7 is a block diagram illustrating a main memory illustrated in FIG. 1 according to other example embodiments of the inventive concept. Referring to FIGS. 2, 4 and 7, a main memory 1200c may include the memory controller interface 1230, the auxiliary interface 1240, a first memory cell array 1260, and a second memory cell array 1270.

The main memory 1200c further includes the second memory cell array 1270 in comparison with FIG. 4. An operation and a configuration of the memory controller interface 1230 and the auxiliary interface 1240 are the same as those described in FIGS. 2 and 4. Thus, detailed descriptions thereof are omitted.

The first memory cell array 1260 may include a first memory area 1261 and a second memory area 1262. A configuration and an operation of the first memory cell array 1260 are similar to the memory cell array 1250 described in FIG. 4. That is, the first memory area 1261 may correspond to the first addresses and the second memory area 1262 may correspond to the second addresses. The first and second addresses may be allocated by the processor 1100. The first memory area 1261 may be accessed by the processor 1100 through the first input/output path I/O Path1. The second memory area 1262 may be accessed by the processor 1100 through the second input/output path I/O Path2. For example, the second memory area 1262 may be used as a buffer memory of the storage 1300.

The second memory cell array 1270 may be accessed by the storage 1300 through a third input/output path I/O Path3. In the embodiment of FIG. 7, the second memory cell array 1270 may be physically separated from the first memory cell array 1260. Thus, the access through the third input/output path may not collide with the access through the second input/output path. For example, the second memory cell array 1270 may be used as a buffer memory of the storage 1300.

In the embodiment of FIG. 7, the access through the second input/output path has lower priority than the access through the third input/output path. That is, the storage 1300 accesses the second memory cell array 1270 in preference to the second memory area 1262. When the second memory cell array 1270 is filled with stored data, the storage 1300 may access the second memory area 1262. For example, in an initial state, the second memory area 1262 may not be allocated by the processor 1100. Thus, in an initial state, the storage 1300 may not access the second memory area 1262. In this case, the processor 1100 may allocate second addresses corresponding to the second memory area 1262 by a request from at least one of the storage 1300 and the processor 1100. When the second addresses are allocated, the second addresses (or together with the first addresses) may be provided to the storage 1300. In some embodiments, the allocated second addresses (or together with the first addresses) may be provided to the memory controller 1110 or the storage controller 1120.

Similar to the embodiment of FIG. 4, the first memory area 1261 and the second memory area 1262 may be reallocated by the processor 1100 if necessary. In response to a reallocation request of the first and second memory areas 1261 and 1262 generated by at least one of the processor 1100 and the storage 1300, the processor 1100 may reallocate the first and second addresses. The reallocated second addresses (or together with the first addresses) are provided to the storage 1300 by the processor 1100. The storage 1300 updates the reallocated second addresses (in the case where the first addresses are provided, together with the first addresses). If necessary, the reallocated second addresses (or together with the first addresses) may be provided to the memory controller 1110 or the storage controller 1120 again. The memory controller 1110 or the storage controller 1120 may update the reallocated second addresses (in the case where the first addresses are provided, together with the first addresses). The memory controller 1110 and the storage 1300 access storage spaces corresponding to the first and second addresses, respectively.

In the embodiment of FIG. 7, the storage 1300 preferentially accesses the second memory cell array 1270 physically separated from the first memory cell array 1260. Thus, in an initial state, the processor 1100 does not generate addresses inside the main memory 1200c, which the storage 1300 may access. Thus, operation throughput of the processor 1100 can be reduced. When the second memory cell array 1270 is full, the storage 1300 accesses the second memory area 1262. As described above, a size of the storage space of the second memory area 1262 may be adjusted by the processor 110. Thus, the processor 1100 can efficiently manage the first and second memory areas 1261 and 1262 according to an operating situation.

Figure 8:
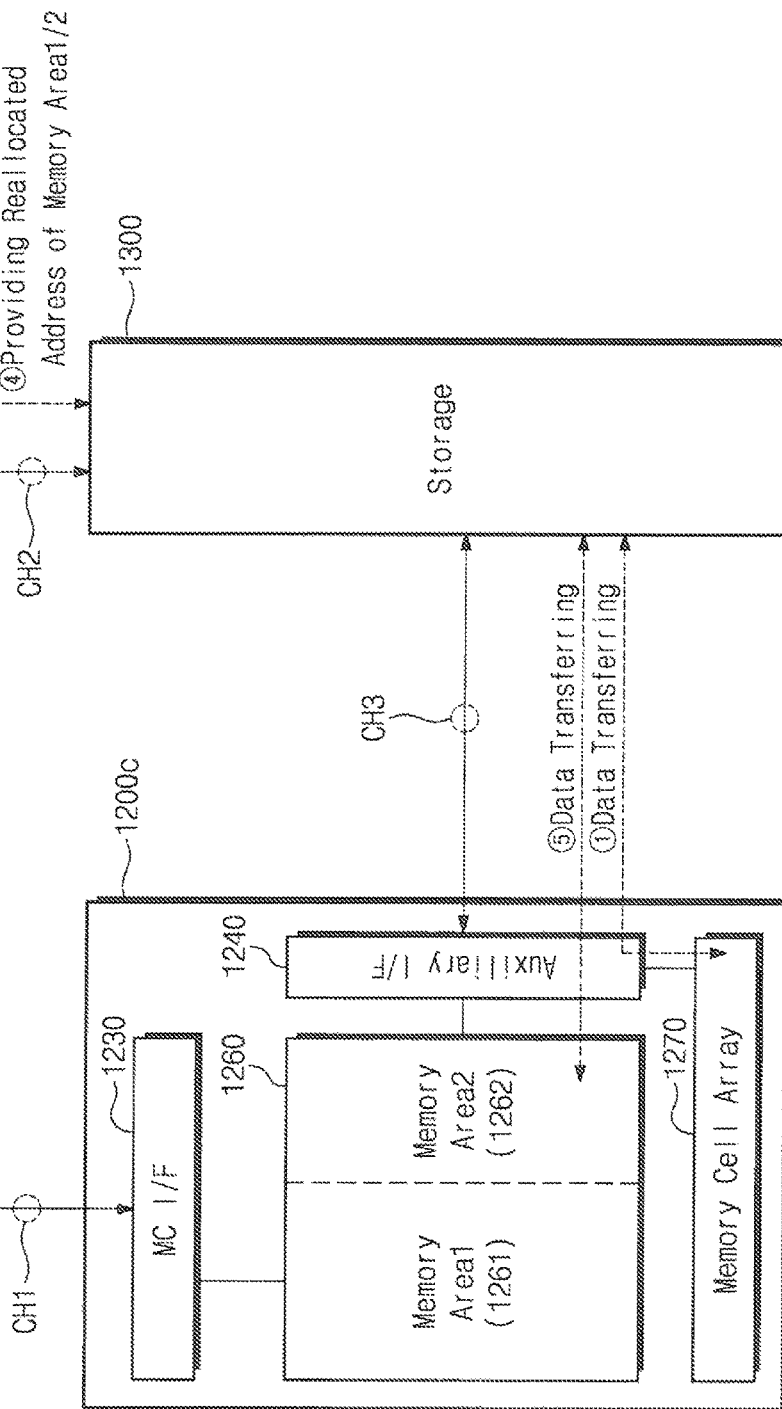
FIG. 8 is a view illustrating an operation of a memory system including a main memory of FIG. 7.

FIG. 8 is a view illustrating an operation of a memory system including a main memory of FIG. 7. Referring to FIGS. 3, 7 and 8, after a reallocation request of the first and second memory areas 1261 and 1262 occurs, an operation of a memory system 1000c including the main memory 1200c is illustrated.

As described above, in an initial state, the second memory area 1262 may not be allocated. Before the reallocation request of the first and second memory areas 1261 and 1262 occurs, the storage 1300 accesses the second memory cell array 1270. Operation of the memory system 1000c from after the memory system 1000c begins a booting or an initialization until before a reallocation request occurs is the same as that described with reference to FIG. 3. Thus, a detailed description thereof is omitted.

After a booting or an initialization of the memory system 1000c is completed, the storage 1300 exchanges necessary data with the second memory cell array 1270 (block ①). In an operation of the memory system 1000c, a reallocation request of the first and second memory areas 1261 and 1262 may be generated (block ②). The reallocation request may be generated by at least one of the processor 1100 and the storage 1300. The processor 1100 reallocates the first memory area 1261 and the second memory area 1262 (block ③). The processor 1100 reallocates the first and second addresses to correspond to the first memory area 1261 and the second memory area 1262, respectively.

The processor 1100 provides the reallocated second addresses (or together with the first addresses) to the storage 1300 again (block ④). The storage 1300 updates the reallocated second addressee (in the case where the first addresses are provided, together with the first addresses). If necessary, the reallocated second addresses (or together with the first addresses) may be provided to the memory controller 1110 or the storage controller 1120 again. The memory controller 1110 or the storage controller 1120 updates the reallocated second addresses (in the case where the first addresses are provided, together with the first addresses).

The storage 1300 may access the second memory area 1262 corresponding to the reallocated second addresses and may exchange data with the second memory area 1262 (block ⑤). The memory controller 1110 may also access the first memory area 1261 corresponding to the reallocated first addresses and may exchange data with the first memory area 1261.

Figure 9:
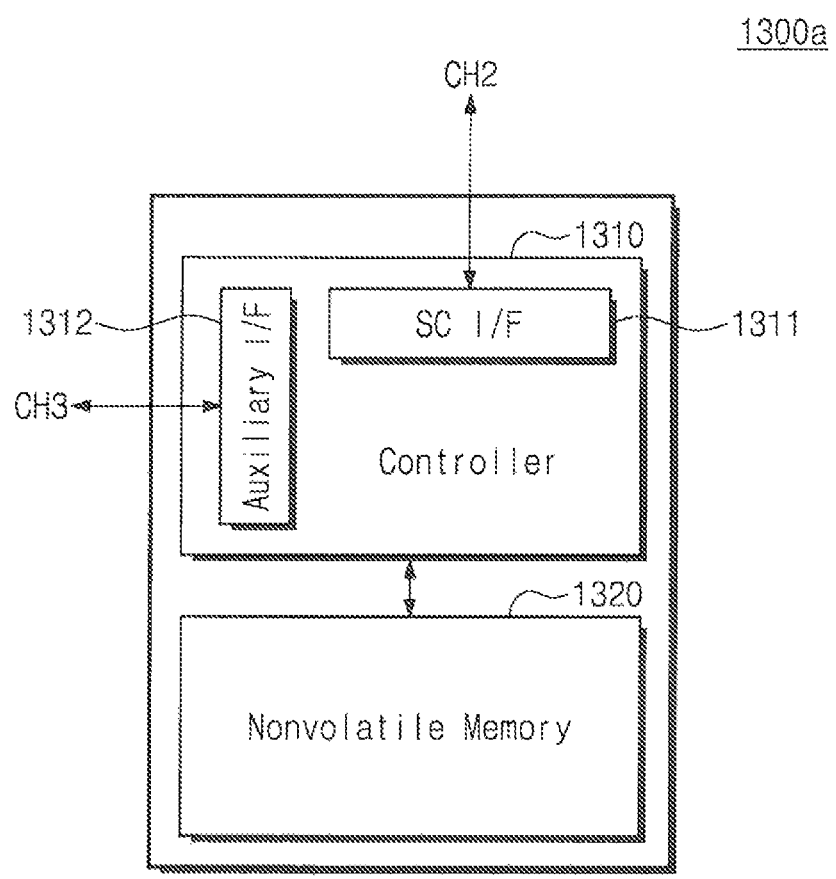
FIGS. 9 through 11 are block diagrams illustrating embodiments of a storage device connected to a main memory of FIG. 1.
Figure 10:
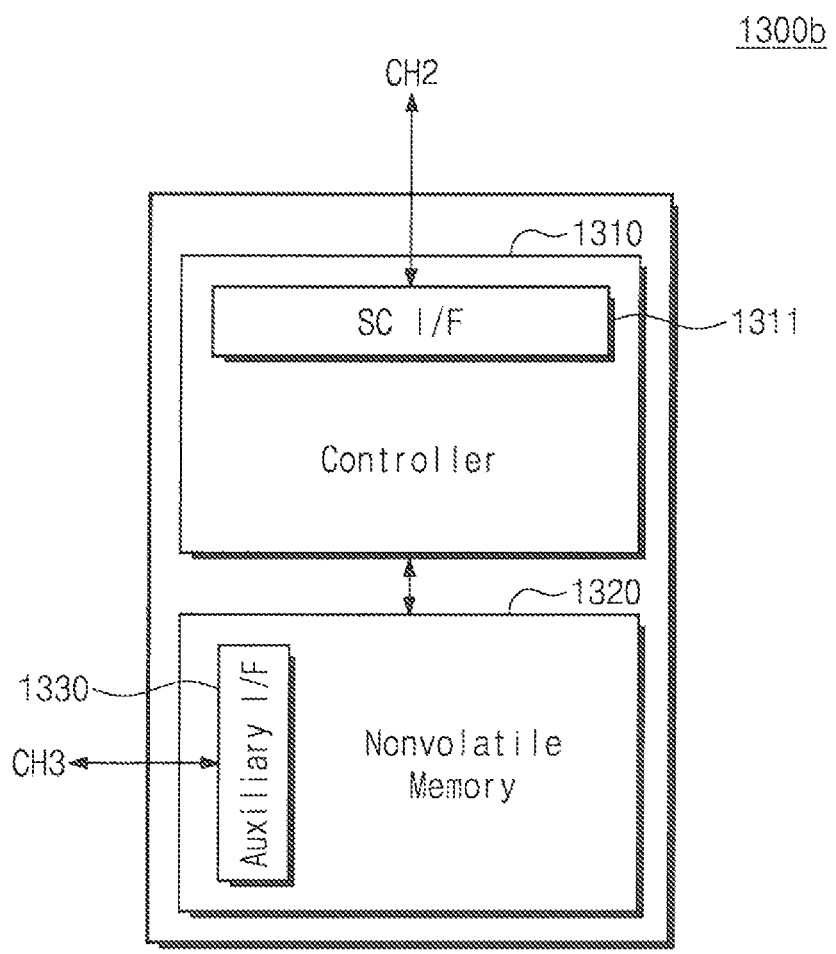
Figure 11:
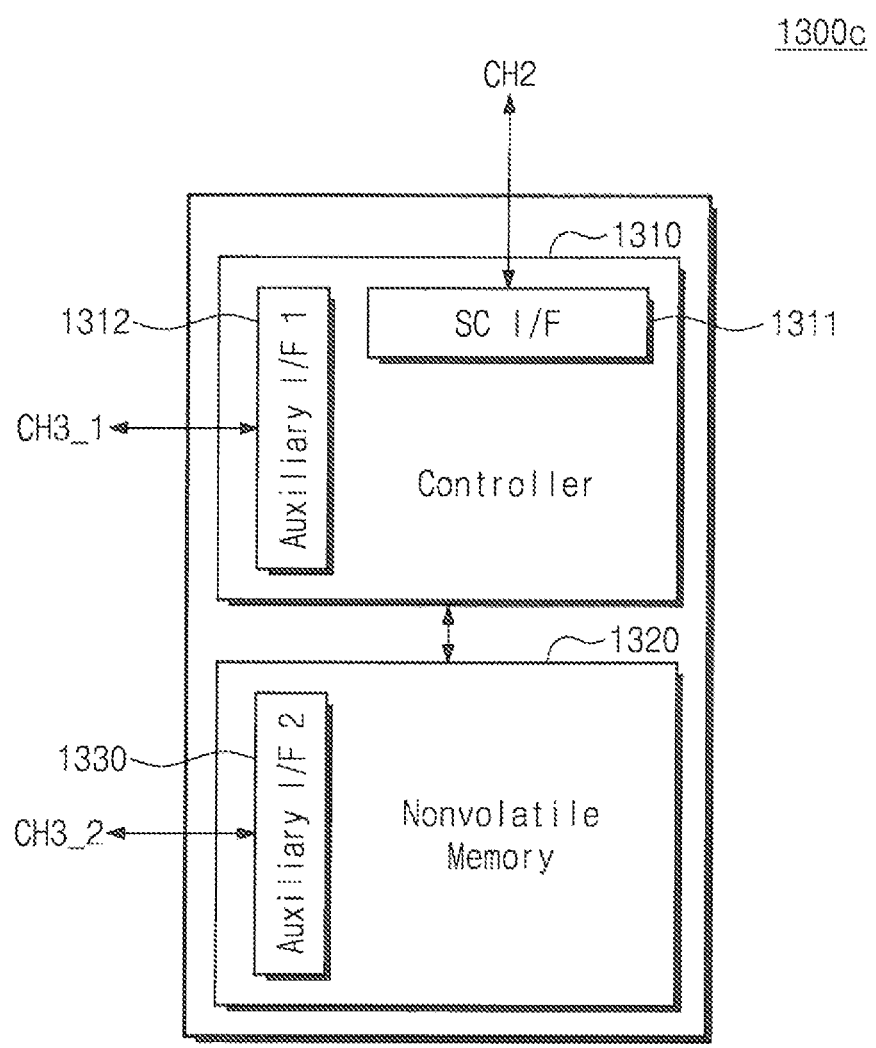

FIGS. 9 through 11 are block diagrams illustrating embodiments of a storage device connected to a main memory of FIG. 1. Referring to FIGS. 1, and 9 through 11, the main memory 1200 may be physically connected to the storage 1300 in various ways through the third channel CH3.

In embodiments of FIGS. 9 through 11, storage modules (1300a to 1300c) may include a controller 1310 and a nonvolatile memory 1320. The controller 1310 controls an overall operation of the nonvolatile memory 1320. The controller 1310 communicates with the storage controller 1120 of the processor 1100. The controller 1310 may include a storage controller interface 1311 to communicate with the storage controller 1120.

The storage controller interface 1311 is connected to the storage controller 1120 of the processor 1100 through the second channel CH2. The storage controller interface 1311 may include various types of circuits described above to drive an interface of the second channel CH2. The storage controller interface 1311 may transmit data provided from the processor 1100 through the second channel CH2 to the nonvolatile memory 1320 or may transmit data which is read from the nonvolatile memory 1320 to the processor 1100 through the second channel CH2. The nonvolatile memory 1320 may include the various a nonvolatile memories described in FIG. 1.

The storage 1300 may be implemented in the form of eMMC. For example, the storage controller interface 1311 may be a parallel interface (e.g., a MMC interface). In other embodiments, the storage controller interface 1311 may also be a serial interface (e.g., UHS-II, UFS interface). In still other embodiments, the storage controller interface 1311 may be a NAND interface.

The storage 1300 may be implemented in the form of UFS. For example, the storage 1300, which is implemented in the form of UFS, may communicate with the processor 1100 through a UFS interface. In other embodiments, the storage 1300 may include a bridge to communicate with the processor 1100 through other interfaces which are not the UFS interface. The storage 1300, which is implemented in the form of removable UFS card, may communicate with the processor 1100 through various card interfaces (e.g., UFDs, MMC, eMMC SD (secure digital), mini SD, Micro SD, etc.).

The storage 1300 may be implemented in the form of SSD further including a separate cache memory (not shown). In some embodiments, the cache memory may be implemented by a volatile memory device (e.g., DRAM, etc.). For example, the storage 1300, which is implemented in the form of SSD, may communicate with the processor 1100 through interfaces (e.g., SATA, mSATA, PCIe, etc.).

Referring to FIG. 9, the controller 1310 of the storage 1300a may be connected to the main memory 1200. In the embodiment of FIG. 9, the controller 1310 may further include an auxiliary interface 1312. The storage 1300a may be connected to the auxiliary interface 1240 of the main memory 1200 through the auxiliary interface 1312 and the third channel CH3. The auxiliary interface 1312 may include the various types of circuits described above to drive an interface of the third channel CH3. The auxiliary interface 1312 is also configured to be compatible with the auxiliary interface 1240 of the main memory 1200. The controller 1310 may exchange data (e.g., data, command, address, meta data of the main memory 1200, etc.) with the main memory 1200 through the auxiliary interface 1312.

Referring to FIG. 10, the nonvolatile memory 1320 of the storage 1300b may be connected to the main memory 1200. In the embodiment of FIG. 10, the nonvolatile memory 1320 may further include an auxiliary interface 1330. The storage 1300b may be connected to the auxiliary interface 1240 of the main memory 1200 through the auxiliary interface 1330 and the third channel CH3. A configuration and an operation of the auxiliary interface 1330 are the same as those of the auxiliary interface 1312 of FIG. 9. The controller 1310 may exchange necessary data with the main memory 1200 through the auxiliary interface 1330.

Referring to FIG. 11, the controller 1310 and the nonvolatile memory 1320 of the storage 1300c may each be connected to the main memory 1200. In the embodiment of FIG. 11, the controller 1310 may further include a first auxiliary interface 1312 and the nonvolatile memory 1320 may further include a second auxiliary interface 1330. The third channel CH3 may be divided so as to comprise two channels (CH3_1, CH3_2). The two channels (CH3_1, CH3_2) may be implemented in a manner that divides the third channel CH3 without a change of a configuration (e.g., the number of channels, the order of channels, etc.) of the third channel CH3. In the case where the third channel CH3 includes first through tenth conducting wires, the third channel CH3_1 may include first through eighth conducting wires and the third channel CH3_2 may include ninth and tenth conducting wires.

The controller 1310 is connected to the auxiliary interface 1240 of the main memory 1200 through the first auxiliary interface 1312 and the third channel CH3_1. The nonvolatile memory 1320 is connected to the auxiliary interface 1240 of the main memory 1200 through the second auxiliary interface 1330 and the third channel CH3_2. The controller 1310 may exchange data with the main memory 1200 through the first auxiliary interface 1312. Data stored in the nonvolatile memory 1320 also may be provided to the main memory 1200 through the second auxiliary interface 1330 under the control of the controller 1310.

Figure 12:
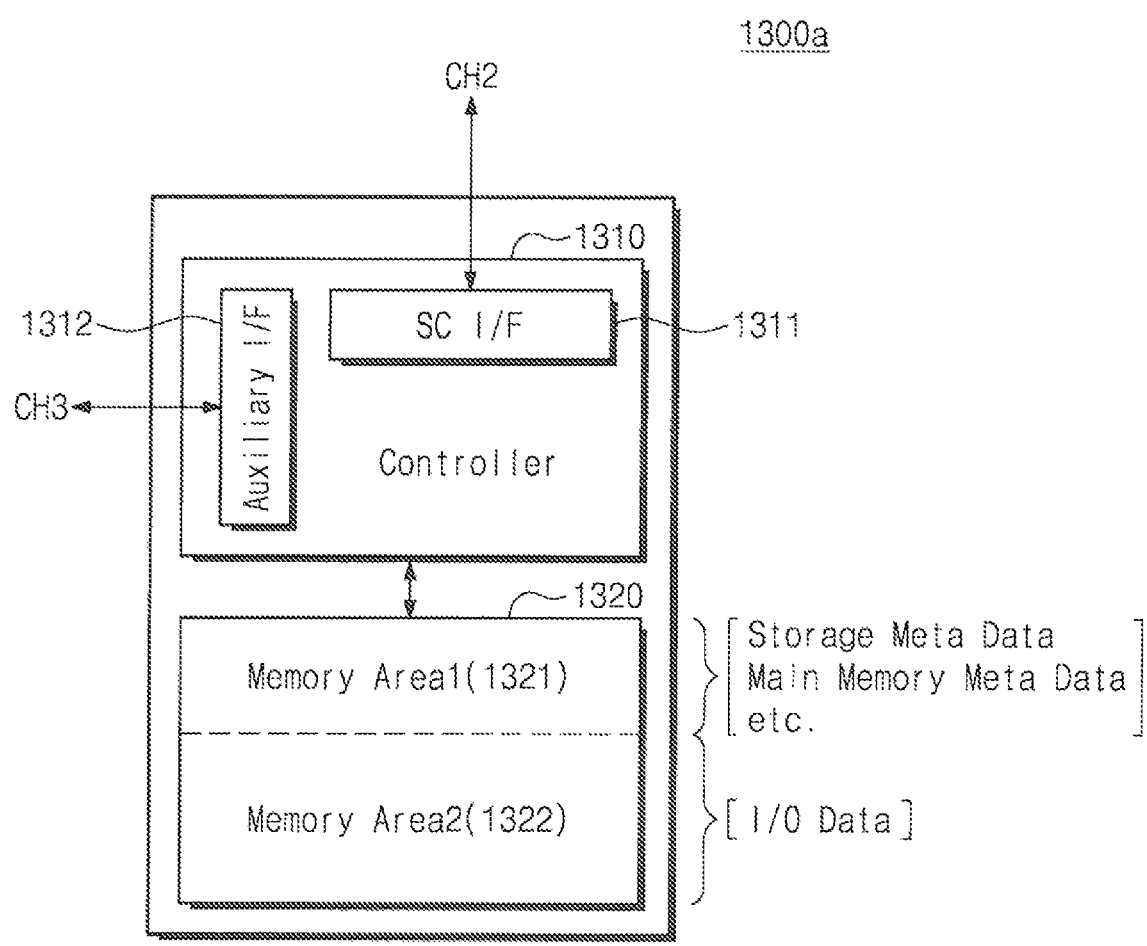
FIG. 12 is an exemplary block diagram illustrating a storage configuration of FIG. 9.
Figure 13:
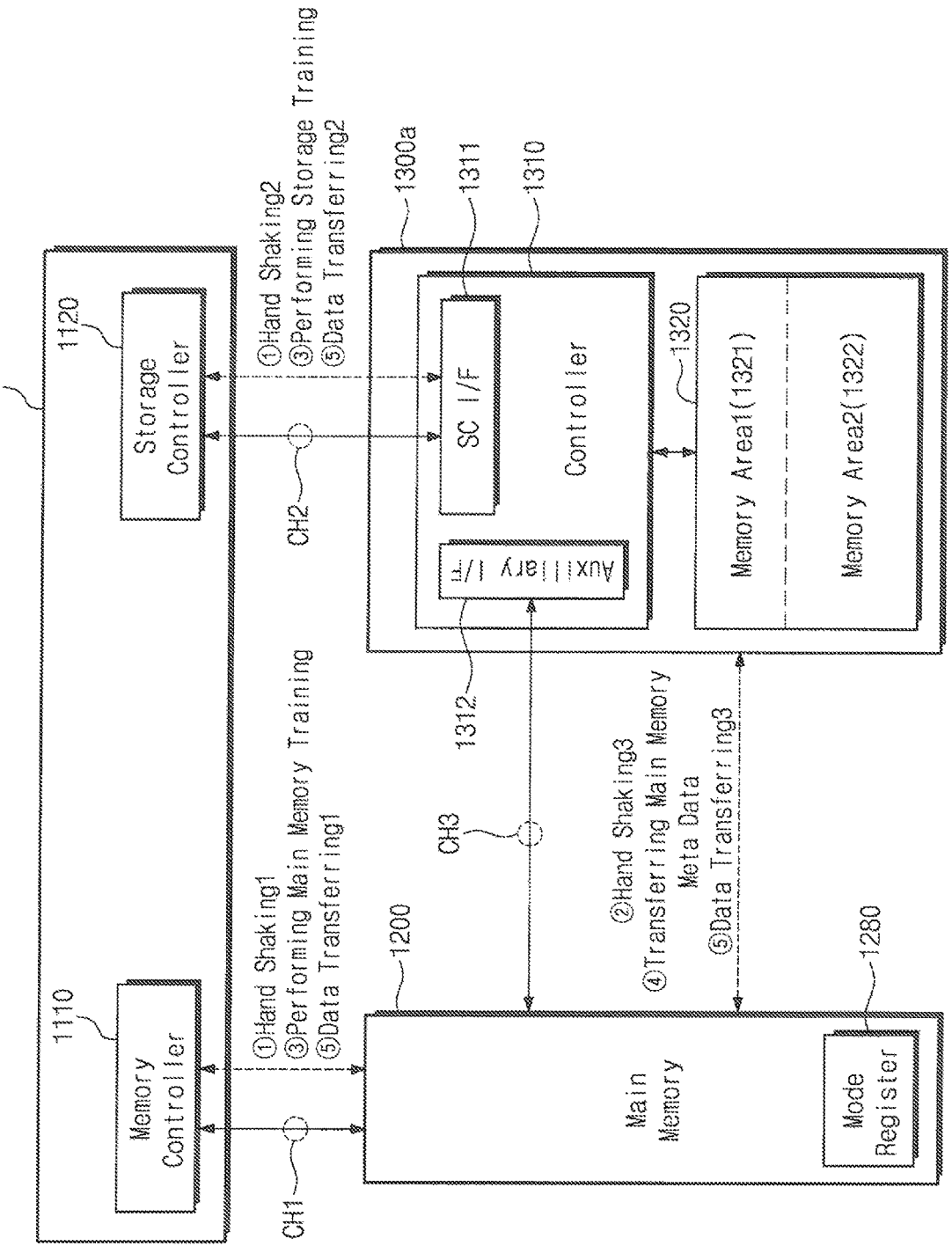
FIG. 13 is a view illustrating an operation of a memory system including the storage of FIG. 12.

In embodiments of FIGS. 12 and 13, it is assumed that the storage 1300 includes a configuration of the storage 1300a illustrated in FIG. 9. The present inventive concept can also be applied to the embodiments of storage components 1300b and 1300c illustrated in FIGS. 10 and 11 respectively.

FIG. 12 is an exemplary block diagram illustrating a configuration of storage of FIG. 9. Referring to FIGS. 1 and 12, the storage 1300a may include the controller 1310 and the nonvolatile memory 1320. The controller 1310 may include the storage controller interface 1311 and the auxiliary interface 1312. Because a configuration and an operation of the controller 1310 have been described with reference to FIG. 9, detailed descriptions thereof are omitted.

The nonvolatile memory 1320 may include a first memory area 1321 and a second memory area 1322. The first memory area 1321 may correspond to a meta area. For example, meta data, FTL (flash translation layer) execution data, firmware, etc. of the storage 1300 may be stored in the first memory area 1321. For example, meta data of the main memory 1200 may be further stored in the first memory area 1321. As described with reference to FIG. 1, the meta data of the main memory 1200 may be generated by the processor 1100 based on a result of a training performed on the main memory 1200.

The controller 1310 may provide meta data of the main memory 1200 stored in the nonvolatile memory 1320 to the main memory 1200. The main memory 1200 may operate using the provided meta data of the main memory 1200. As described above, for example, the meta data may include, but is not limited to, a refresh period per a word line, a cell voltage of a memory, cell (not shown), an input reference voltage, etc. of the memory cell (not shown) of the main memory 1200. The main memory 1200 may be set to be in an optimized condition using the meta data. Thus, an operation efficiency of the main memory 1200 may be improved. As described in FIGS. 1 and 2, the storage 1300a may use the main memory 1200 as a buffer memory. In this case, the storage 1300a may load meta data of the storage 1300a into the main memory 1200 to use it.

The second memory area 1322 may correspond to a data area. Input/output data exchanged between the storage controller 1120 and the controller 1310 may be stored in the second memory area 1322. Input/output data exchanged between the main memory 1200 and the controller 1310 may also be stored in the second memory area 1322.

FIG. 13 is a view illustrating an operation of a memory system including the storage of FIG. 12. Referring to FIG. 13, after a memory system 1000d including the storage 1300a begins a booting or an initialization, an operation of the memory system 1000d is illustrated.

First, the memory controller 1110 performs a handshaking1 operation with a memory controller interface (not shown) and the storage controller 1120 performs a handshaking2 operation with the storage controller interface 1311 (block ①). After the handshaking operations, the memory controller 1110 recognizes a storage space of the main memory 1200. The storage controller 1120 also recognizes a storage space of the second memory area 1322 of the nonvolatile memory 1320.

After the main memory 1200 and the storage 1300a complete a preparation procedure, the main memory 1200 performs a handshaking3 operation with the auxiliary interface 1312 of the storage 1300 (block ②). The storage 1300a recognizes a specific storage space of the main memory 1200. For example, the storage space of the main memory 1200 recognized by the storage 1300a may be distinct from the storage space of the main memory 1200 recognized by the processor 1100.

Subsequently, the processor 1100 performs a training of the main memory 1200 and a training of the storage 1300a (block ③). For example, the training may include an input/output training for optimizing operations of the main memory 1200 and the storage 1300a. The processor 1100 generates meta data of the main memory 1200 based on a training result of the main memory 1200. The processor 1100 provides the generated meta data to the controller 1310. The controller 1310 stores the meta data in the first memory area 1321.

The controller 1310 provides meta data stored to the main memory 1200 in response to a request (block ④). The request may be generated from the memory controller 1110, the storage controller 1120, the controller 1310, etc. The request also may be generated when the processor 1100 accesses the main memory 1200, when the memory system 1000d is booted or initialized, or when a training of the main memory 1200 is newly performed. The main memory 1200 stores the provided meta data.

For example, the main memory 1200 may further include a mode register 1280. The mode register 1280 is a circuit (or device) that stores setting information to set various functions, operation modes, operating environment, etc. of the main memory 1200. In FIGS. 1 through 12, although not illustrated, main memories (1200a to 1200c) may further include the mode register 1280.

The main memory 1200 may store setting information included in the meta data in the mode register 1280. The main memory 1200 sets an operation condition according to the information stored in the mode register 1280. The main memory 1200 performs read, write, and refresh operations based on the set operation condition. Setting of the main memory 1200 and the storage 1300a is completed, and the processor 1100, the main memory 1200, and the storage 1300a may exchange data with one another (block ⑤). Specifically, for example, the storage 1300a may load meta data of the storage 1300a into the main memory 1200 to use it. The storage 1300a may also temporarily store input/output data exchanged between the storage 1300a and the main memory 1200 in the main memory 1200 to use it.

Figure 14:
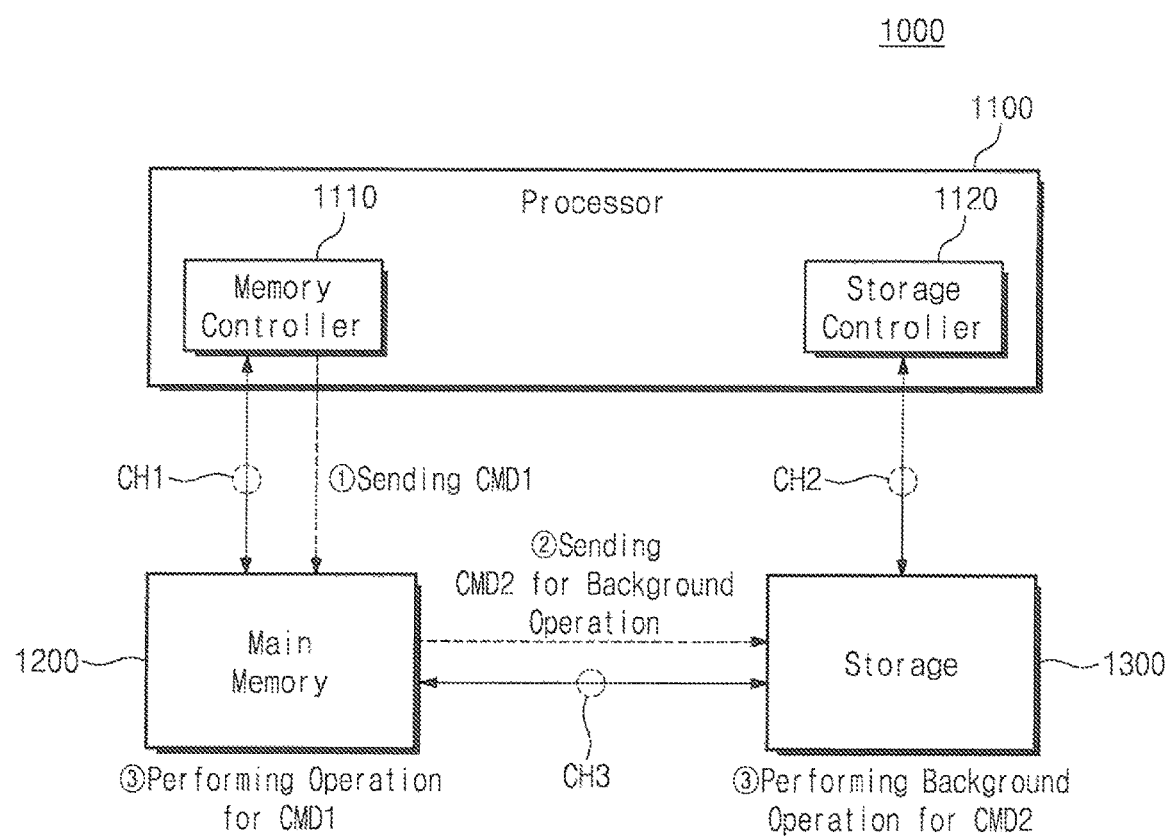
FIGS. 14 and 15 are views illustrating an operation of a memory system of FIG. 1 according to other example embodiments of the inventive concept.
Figure 15:
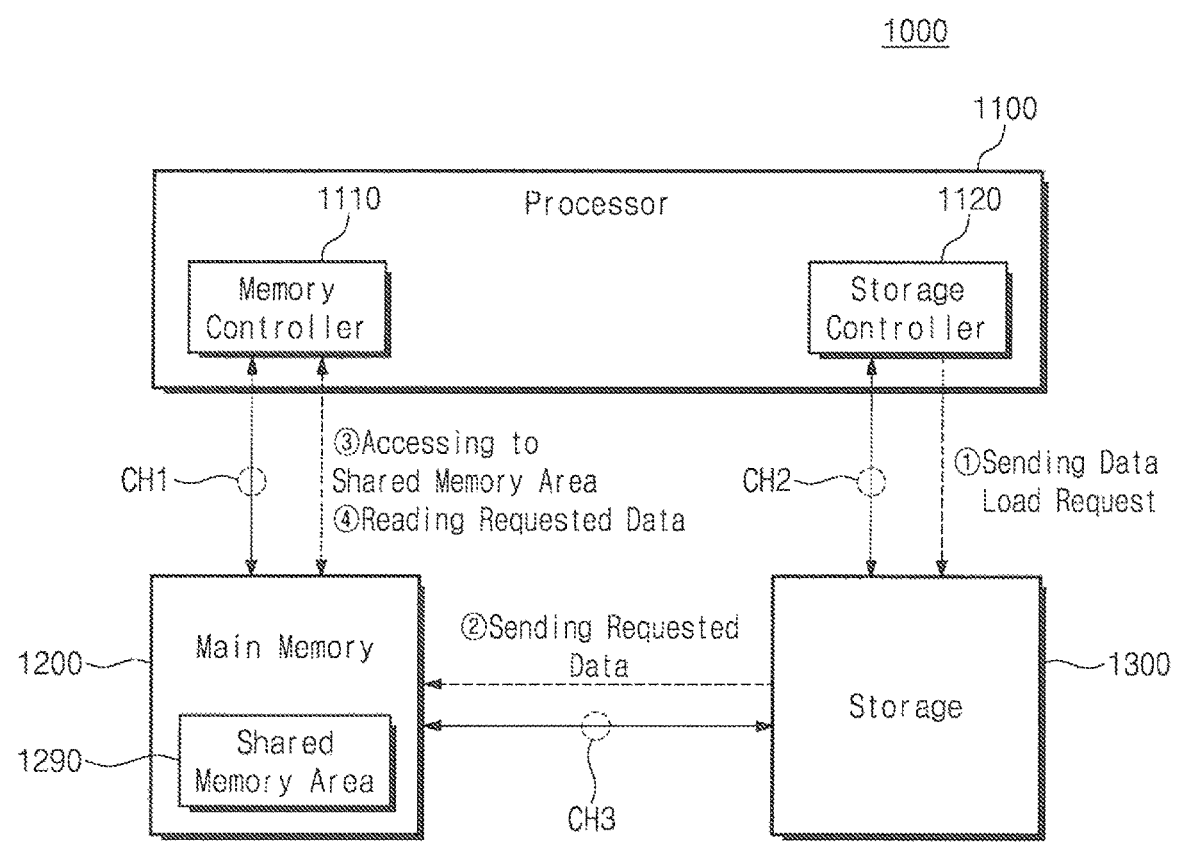

FIGS. 14 and 15 are views illustrating an operation of a memory system of FIG. 1 according to other example embodiments of the inventive concept. Referring to FIGS. 1 and 14, the storage 1300 may use a command provided from the processor 1100 to the main memory 1200 as a command for a background operation of the storage 1300.

First, the processor 1100 provides a first command CMD1 to the main memory 1200 (block ①). For example, the processor 1100 may not access the main memory 1200 while the main memory 1200 performs an operation according to the first command CMD1. For example, the first command CMD1 may include a self-refresh command of the main memory 1200, a command for making the main memory 1200 enter a power down mode, etc.

The main memory 1200 provides a second command CMD2 generated based on the first command CMD1 to the storage 1300 (block ②). The second command CMD2 allows the storage 1300 to perform a background operation. Before the main memory 1200 performs an operation according to the first command CMD1, the main memory 1200 generates the second command CMD2 based on the first command CMD1. Although not illustrated, the main memory 1200 may further include a command decoder that decodes the first command CMD1, and a conversion circuit that converts the decoded command into the second command CMD2, which the storage 1300 can recognize.

In the case where the storage 1300 is implemented based on a flash memory, before writing data, the storage 1300 has to perform an erase operation of a space in which the data will be written in units of blocks. This is because unlike a hard disk, the flash memory does not support an overwrite operation. Thus, the flash memory-based storage 1300 has to perform a background operation according to a flash memory's own unique characteristic. For example, the background operation may include a wear-leveling operation, a garbage collection operation, etc. The wear-leveling operation is an operation for distributing a wear level of a flash memory cell equally or more uniformly. For example, a swap operation in which data is exchanged between a memory cell having a high wear level and a memory cell having a low wear level may be performed through wear-leveling. Garbage collection is an operation that moves valid data of a first block to a second block and then deletes or invalidates the first block. A flash memory can secure (or arrange) an invalid space by the garbage collection operation. That is, the second command CMD2 allows the storage 1300 to perform one or more background operations, such as a wear leveling, a garbage collection, etc.

The main memory 1200 and the storage 1300 perform operations of the first command CMD1 and the second command CMD2, respectively (block ③). As described above, while the processor 1100 does not access the main memory 1200, the main memory 1200 performs an operation according to the first command CMD1. While the main memory 1200 performs an operation according to the first command CMD1, the storage 1300 may perform a background operation at the same time. The main memory 1200 and the storage 1300 can perform the operations according to the first command CMD1 and the second command CMD2, respectively, at the same time is as follows.

Generally, the processor 1100 does not directly use data of the storage 1300. This is because an operation speed of the main memory 1200 is typically higher than an operation speed of the storage 1300. That is, the processor 1100 writes data generated during an operation procedure in the main memory 1200 to use it. When data which the processor 1100 needs does not exist in the main memory 1200, the processor 1100 also reads necessary data from the storage 1300 and writes or loads the read data in the main memory 1200 to use it. Thus, while the processor 1100 does not access the main memory 1200, the processor 1100 does not access the storage 1300. Consequently, while the processor 1100 does not access the main memory 1200, the storage 1300 may perform a background operation.

According to the embodiment of FIG. 14, while the main memory 1200 performs a specific operation, the processor 1100 does not provide the second command CMD2 for the background operation to the storage 1300. In this case, the processor 1100 does not generate the second command CMD2 and does not access the storage 1300. Thus, an operational burden of the processor 1100 is reduced and a command efficiency of the processor 1100 may increase.

Referring to FIGS. 1 and 15, the storage 1300 can directly load data stored in the storage 1300 into the main memory 1200 by a request of the processor 1100.

As described in FIG. 14, when data that the processor 1100 needs does not exist in the main memory 1200, the processor 1100 reads necessary data from the storage 1300 and writes or loads the read data in the main memory 1200 to use it. For example, the data that is written or loaded in the main memory 1200 may include an OS hoot image, an application instance, etc.

Unlike as illustrated in FIG. 15, the memory system 1000 may not include the third channel CH3 in some embodiments. That is, the main memory 1200 may not be directly connected to the storage 1300. In this case, the data read from the storage 1300 is written or loaded in the main memory 1200 through the processor 1100 by a request of the processor 1100.

As illustrated in FIG. 15, in contrast, the main memory 1200 may be connected to the storage 1300 through the third channel CH3. In the embodiment of FIG. 15, the data read from the storage 1300 is directly written or loaded in the main memory 1200 through the third channel CH3 by a request of the processor 1100. For example, the main memory 1200 may include a shared memory area 1290 shared by the processor 1100 and the storage 1300.

A specific method of operating the memory system 1000 according to some embodiments of the inventive concept is as follows. First, the processor 1100 transmits a data load request to the storage 1300 (block ①). In response to the data load request, the storage 1300 reads the requested data and provides the read data to the main memory 1200 through the third channel CH3 (block ②). In this case, the storage 1300 may store the read data in the shared memory area 1290. The processor 1100 accesses the shared memory area 1290 through the first channel CH1 (block ③). Subsequently, the processor 1100 reads data requested from the shared memory area 1290 (block ④). According to the embodiment of FIG. 15, because data is directly loaded from the storage 1300 into the main memory 1200, a speed that data read from the storage 1300 is written or loaded in the main memory 1200 may increase.

Figure 16:
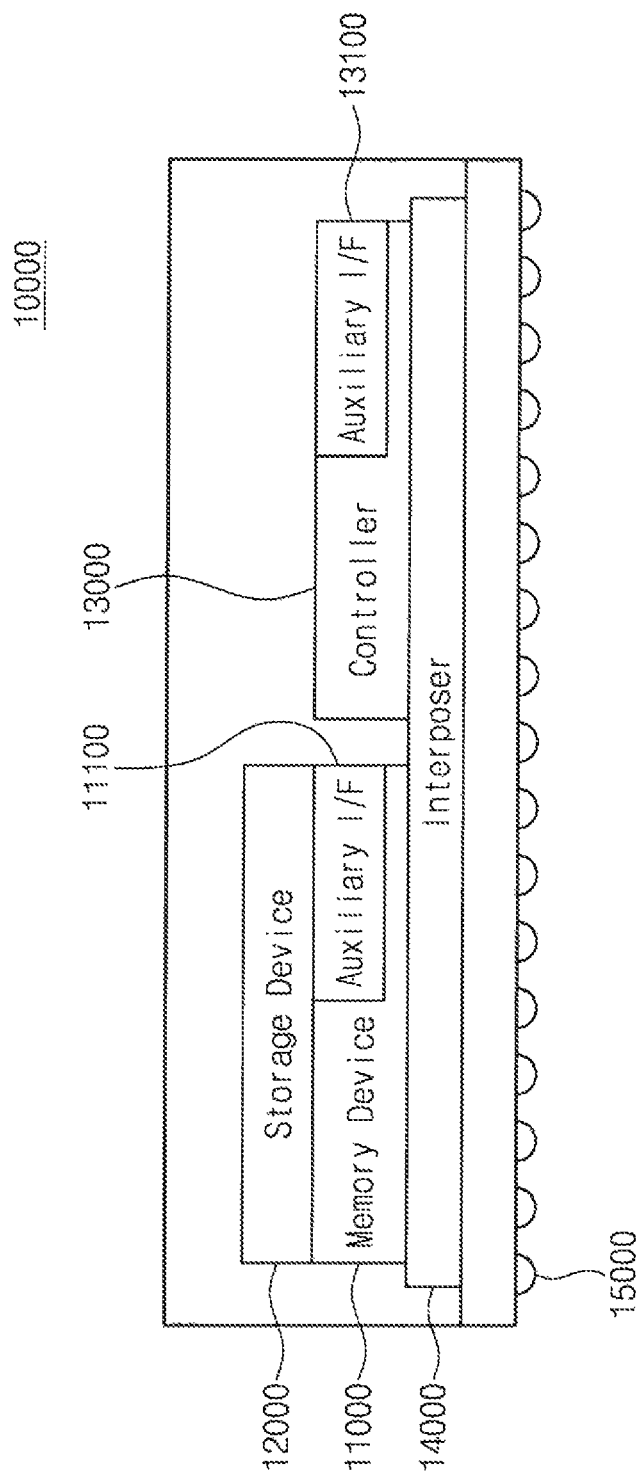
FIG. 16 is a view illustrating a package in which a memory system illustrated in FIG. 1 is integrated.

FIG. 16 is a view illustrating a package in which a memory system illustrated in FIG. 1 is integrated. In FIG. 16, an eMCP (embedded multi-chip package) is illustrated. The eMCP 10000 may include a memory device 11000, a storage device 12000, a controller 13000, an interposer 14000, and a solder ball 15000.

The memory device 11000 may include at least one of the main memories (1200a to 1200c) described with reference to FIGS. 1 through 14. The memory device 11000 may include an auxiliary interface 11100. The auxiliary interface 11100 may correspond to the auxiliary interface 1240 illustrated in FIGS. 1 through 8. The storage device 12000 may include the nonvolatile memory 1320 described with reference to FIGS. 1 through 14. The controller 13000 may include the controller 1310 described with reference to FIGS. 1 through 14. The controller 13000 may include the auxiliary interface 13100. The auxiliary interface 13100 may correspond to the auxiliary interface 1312 illustrated in FIGS. 9 through 13.

In the embodiment of FIG. 16, the memory device 11000 may communicate with the auxiliary interface 13100 of the controller 13000 through the auxiliary interface 11100 and the interposer 14000. For example, the auxiliary interface 11100 of the memory device 11000 may be connected to the interposer 14000 through a bonding wire. Alternatively, the auxiliary interface 11100 of the memory device 11000 may be connected to the interposer 14000 through a TSV (through silicon via). Similar to the memory device 11000, each of the storage device 12000 and the controller 13000 may be connected to the interposer 14000. According to the embodiments of each of FIGS. 9 through 11, the memory device 11000 may be connected to at least one of the storage device 12000 and the controller 13000. However, the examples described above are not to limit the scope of the inventive concept. The memory device 11000, the storage device 12000, and the controller 13000 may be connected to one another in various ways.

Each of the memory device 11000 and the controller 13000 may be connected to a processor (not shown) located outside the eMCP 10000 through the interposer 14000 and the solder balls 15000. The memory device 11000 may communicate with the storage device 12000 and the processor (not shown) respectively by the methods described with reference to FIGS. 1 through 15. Similarly, the storage device 12000 may communicate with the memory device 11000 and the processor (not shown) by the methods described with reference to FIGS. 1 through 15.

In FIG. 16, the eMCP 10000 is illustrated where the memory device 11000, the storage device 12000, and the controller 13000 are integrated in a single package. However, this is merely an example and the scope of the inventive concept is not limited thereto. That is, the inventive concept may be implemented in various forms, such as an ePoP (embedded package on package) form where the eMCP 10000 is integrated together with a processor chip, a form where the storage device 12000 and the controller 13000 are integrated in the form of eMMC and are connected to a processor and a main memory on a board, etc.

Figure 17:
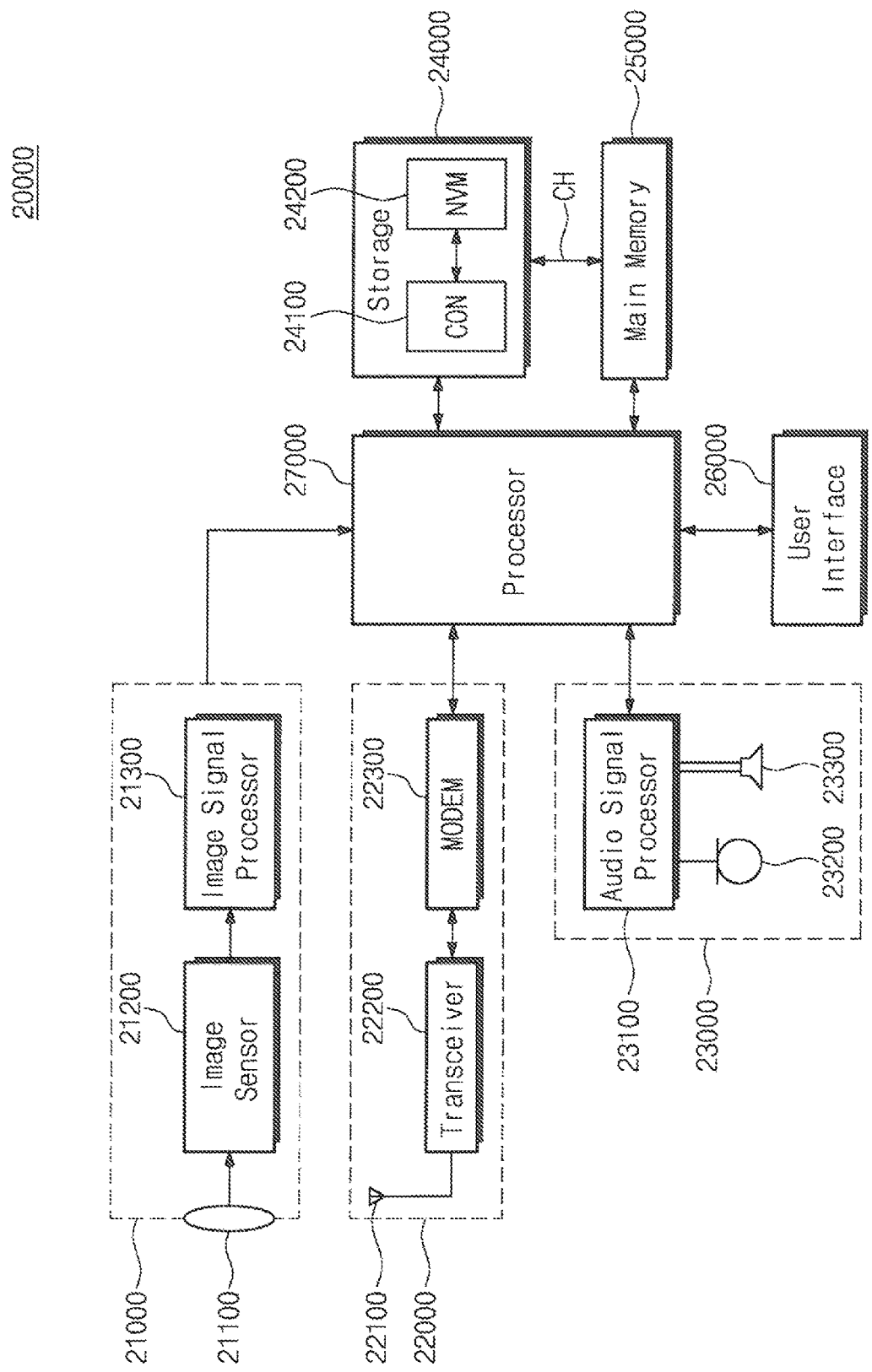
FIG. 17 is a block diagram illustrating a mobile electronic device including a memory system of FIG. 1.

FIG. 17 is a block diagram illustrating a mobile electronic device including a memory system of FIG. 1. Referring to FIG. 17, the mobile electronic device 20000 may include an image processor 21000, a wireless communication block 22000, an audio processor 23000, storage 24000, a main memory 25000, a user interface 26000, and a processor 27000. For example, the mobile electronic device 20000 may be one of a mobile communication terminal, a PDA, a PMP, a digital camera, a smart phone, a tablet, a wearable device, etc.

The image processor 21000 may receive light through a lens 21100. An image sensor 21200 and an image signal processor 21300 included in the image processor 21000 may generate an image based on the received light.

The wireless communication block 22000 may include an antenna 22100, a transceiver 22200, and a modem 22300. The wireless communication block 22000 can communicate with the outside of the mobile electronic device 20000 according to at least one of various communication protocols, such as GSM, CDMA, WDCMA, HSPA, EV-D0, LTE, WiMax, WiFi direct, WiBro, RFID, Bluetooth, NFC, etc.

The modem 22300 may include a communication circuit(s) to process a wireless communication protocol. For example, the modem 22300 may be implemented by a communication circuit chip and may be installed in the mobile electronic device 20000. The audio processor 23000 may process an audio signal using an audio signal processor 23100. The audio processor 23000 may receive an audio input through a microphone 23200 or ma provide an audio output through a speaker 23300.

The storage 24000 may store data for preservation regardless of whether power is supplied. For example, the storage 24000 may include at least one of a flash memory, a PRAM, a MRAM, a ReRAM, FRAM, etc. The memory device 24200 may store data or output the stored data under the control of the memory controller 24100.

The main memory 25000 may temporarily store data used in an operation of the mobile electronic device 20000. For example, the main memory 25000 may be used as a working memory, an operation memory, and/or a buffer memory of the mobile electronic device 20000. The main memory 25000 may temporarily store data processed or to be processed by the processor 27000.

The storage 24000 and the main memory 25000 may operate according to the various embodiments of the inventive concept. The storage 24000 may include at least one of the storage 1300 and the storage device 12000 described with reference to FIGS. 1 through 15. The main memory 25000 may include at least one of the main memory 1200 and the memory device 11000 described with reference to FIGS. 1 through 15. The storage 24000 may be connected to the main memory 25000 through a channel CH.

The user interface 26000 may process an interface between a user and the mobile electronic device 20000 under the control of the processor 27000. For example, the user interface 26000 may include an input interface, such as a keyboard, a keypad, a button, a touch panel, a touch screen, a touch pad, a touch ball, a camera, a mike, a gyroscope sensor, a vibration sensor, etc. For example, the user interface 26000 may include an output interface, such as a display device, a motor, etc. For example, the display device may include at least one of a LCD (liquid crystal display), a LED (light emitting diode) display, an OLED (organic LED) display, an AMOLED (active matrix OLED) display, etc.

The processor 27000 may control an overall operation of the mobile electronic device 20000. The image processor 21000, the wireless communication block 22000, the audio processor 23000, the storage 24000, and the main memory 25000 may process a user command provided through the user interface 2600 under the control of the processor 27000. The image processor 21000, the wireless communication block 22000, the audio processor 23000, the storage 24000, and the main memory 25000 may provide a service to a user through the user interface 26000 under the control of the processor 27000.

The processor 27000 may be implemented in the form of SoC (system on chip). For example, the processor 27000 may include an application processor. The storage 24000, the main memory 25000, and the processor 27000 may operate by the operation methods described with reference to FIGS. 1 through 16. Thus, an operation efficiency of a memory system inside the mobile electronic device 20000 may be improved.

The memory system according to the inventive concept may include a main memory and storage connected to each other. According to example embodiments of the inventive concept, the main memory may store meta data of the main memory in the storage. The main memory may also read stored meta data from storage to use it. The storage may use the main memory as a buffer memory. Thus, the memory system can effectively use the main memory and the storage.

The contents described above are specific embodiments for implementing the inventive concept. The inventive concept may include not only the embodiments described above but also embodiments in which a design is simply or easily capable of being changed. The inventive concept may also include technologies easily changed to be implemented using embodiments.

What is claimed is:

1. A memory system comprising:
   a storage device including a first interface circuit configured to be connected to a processor and a second interface circuit distinct from the first interface circuit; and
   a memory device including a third interface circuit configured to be connected to the processor based on a DRAM interface, a fourth interface circuit configured to be distinct from the third interface circuit and configured to be connected to the second interface circuit, and a random access memory divided into a first memory area and a second memory area,
   wherein the first memory area is accessed by the processor through the third interface circuit and the second memory area is accessed by the storage device through the second interface circuit and the fourth interface circuit;
   wherein the storage device comprises:
   a controller including the first interface circuit; and
   a nonvolatile memory including the second interface circuit, the controller being configured to control operation of the nonvolatile memory.

2. The memory system of claim 1, wherein the first memory area corresponds to a first memory cell array of the memory device and the second memory area corresponds to a second memory cell array of the memory device physically separatedTrom the first memory cell array.

3. The memory system of claim 1, wherein the first memory area corresponds to first addresses allocated from the processor and the second memory area corresponds to second addresses allocated from the processor, the second addresses being different from the first addresses.

4. The memory system of claim 3, wherein the first addresses and the second addresses are reallocated in response to a request from at least one of the processor and the storage device.

5. The memory system of claim 1, wherein the memory device further comprises:
   a first memory cell array including the first memory area and the second memory area; and a second memory cell array physically separated from the first memory cell array,
wherein the first memory area corresponds to first addresses allocated from the processor and the second memory area corresponds to second addresses allocated from the processor, the second addresses being different from the first addresses.

6. The memory system of claim 5, wherein the second memory cell array is configured for access by the storage device in preference to the second memory area.

7. The memory system of claim 5, wherein the first addresses and the second addresses are reallocated in response to a request from at least one of the processor and the storage device.

8. The memory system of claim 1, wherein the storage device is configured to store meta data of the memory device generated based on a training result of the memory device.

9. The memory system of claim 8, wherein the storage device provides the meta data to the memory device through the second interface circuit and the fourth interface circuit.

10. The memory system of claim 9, wherein the memory device further comprises a mode register for storing the provided meta data.

11. A method of operating a memory system including a storage device and a memory device connected to the storage device, the method comprising:
performing, by a processor, a first handshaking operation with the storage device and a second handshaking operation with the memory device;
dividing the memory device into a first memory area and a second memory area;
allocating the first memory area to first addresses;
allocating the second memory area to second addresses;
providing, by the processor, the second addresses to the storage device;
performing, by the storage device, a third handshaking operation with the memory device;
generating a training result of the memory device; and
configuring the storage device to store meta data of the memory device based on the training result.

12. The method of operating the memory system of claim 11, further comprising:
accessing the first memory area using the processor; and
accessing the second memory area using the storage device.

13. The method of operating the memory system of claim 11, further comprising:
reallocating, by the processor, the first addresses and the second addresses in response to a request of at least one of the processor and the storage device; and
providing, by the processor, the reallocated second addresses to the storage device.

14. A memory system, comprising:
a volatile main memory device comprising a first auxiliary interface circuit;
a nonvolatile storage device comprising a second auxiliary interface circuit; and
a processor component comprising a main memory controller that is configured to control operation of the volatile main memory device and a storage controller that is configured to control operation of the nonvolatile storage device;
wherein the volatile main memory device and the nonvolatile storage device are configured to communicate via the first auxiliary interface circuit and the second auxiliary interface circuit without passing through the processor component; and
wherein the volatile main memory device comprises a first memory cell array and a second memory cell array, and the first memory cell array and the second memory cell array are physically separate components that are independently replaceable.

15. The memory system of claim 14, wherein the volatile main memory device comprises:
a memory controller interface circuit;
wherein the first memory cell array is configured to be accessible to the processor component via the memory controller interface circuit; and
wherein the second memory cell array is configured to be accessible to the nonvolatile storage device via the first auxiliary interface circuit and the second auxiliary interface circuit.

16. The memory system of claim 15, wherein the first memory cell array and the second memory cell array comprise a first area and a second area, respectively, of a monolithic memory cell array device; and
wherein the processor component is configured to allocate first addresses to the first memory cell array and is configured to allocate second addresses to the second memory cell array, the first addresses being unique from the second addresses.

17. The memory system of claim 16, wherein the volatile main memory device further comprises:
a preferential memory cell array that is configured to be preferentially accessible to the nonvolatile storage device via the first auxiliary interface circuit and the second auxiliary interface circuit relative to the second area of the monolithic memory cell array device.

* * * * *